United States Patent [19]

Williams et al.

[11] 4,080,780
[45] Mar. 28, 1978

[54] ELECTRONIC TIME KEEPING SYSTEM

[75] Inventors: Clark R. Williams; Robert H. Schnurr, both of Dallas, Tex.

[73] Assignee: Texas Instruments Incorporated, Dallas, Tex.

[21] Appl. No.: 547,147

[22] Filed: Feb. 5, 1975

Related U.S. Application Data

[62] Division of Ser. No. 264,212, Jun. 19, 1972, Pat. No. 3,886,726.

[51] Int. Cl.² .................... G04B 19/30; G04C 3/00; H03K 1/02
[52] U.S. Cl. .................... 58/50 R; 58/23 A; 58/23 BA; 307/296 A
[58] Field of Search .............. 58/23 BA, 23 A, 23 R, 58/50 R; 235/92 T; 307/213, 296, 297; 340/333, 336; 357/40, 46; 324/186

[56] References Cited

U.S. PATENT DOCUMENTS

| | | |
|---|---|---|
| 3,617,778 | 11/1971 | Korom ........................... 307/213 |
| 3,738,099 | 6/1973 | Tanaka ........................... 58/4 A |
| 3,750,383 | 8/1973 | Kakizawa ........................ 58/23 BA |
| 3,772,874 | 11/1973 | Lefkowitz ....................... 58/4 A |

Primary Examiner—Edith S. Jackmon
Attorney, Agent, or Firm—Rene' E. Grossman; Stephen S. Sadacca

[57] ABSTRACT

An electronic timekeeping device includes bipolar integrated circuit implemented logic in combination with a liquid crystal display. The bipolar circuitry is configured to effectively implement logic functions with a supply voltage of only one volt. Drive circuitry is coupled to the liquid crystal display to effectively impress an a.c. voltage across the liquid crystal cell when display is required. The logic circuitry includes a transistor configured current source regulated to effectively maintain a current independent of source and load variations, enabling integrated circuit implementation without utilizing large value external resistors. The display circuitry includes logic for enabling display of the calendar date and time, reset capabilities independent of date increments are provided.

4 Claims, 39 Drawing Figures

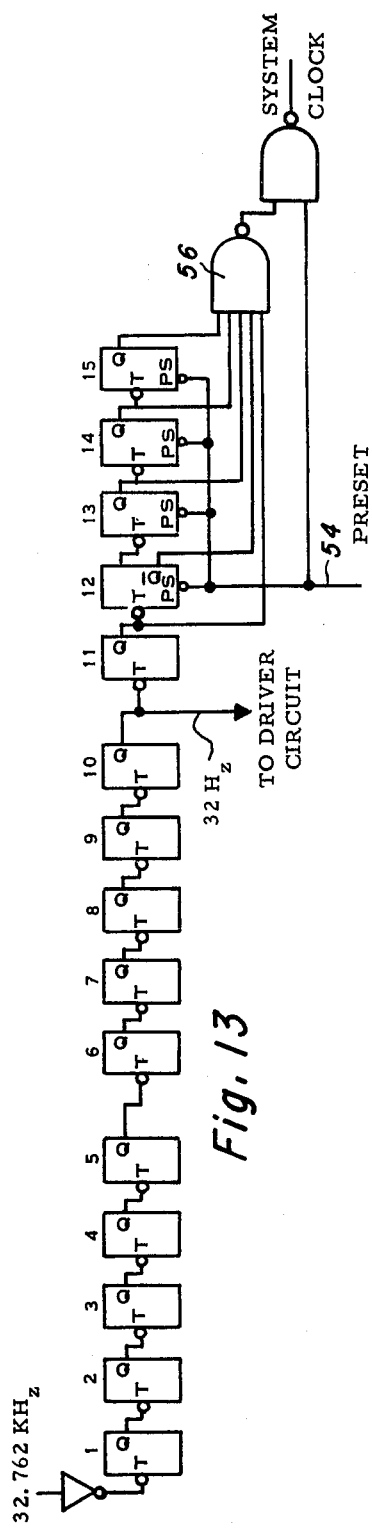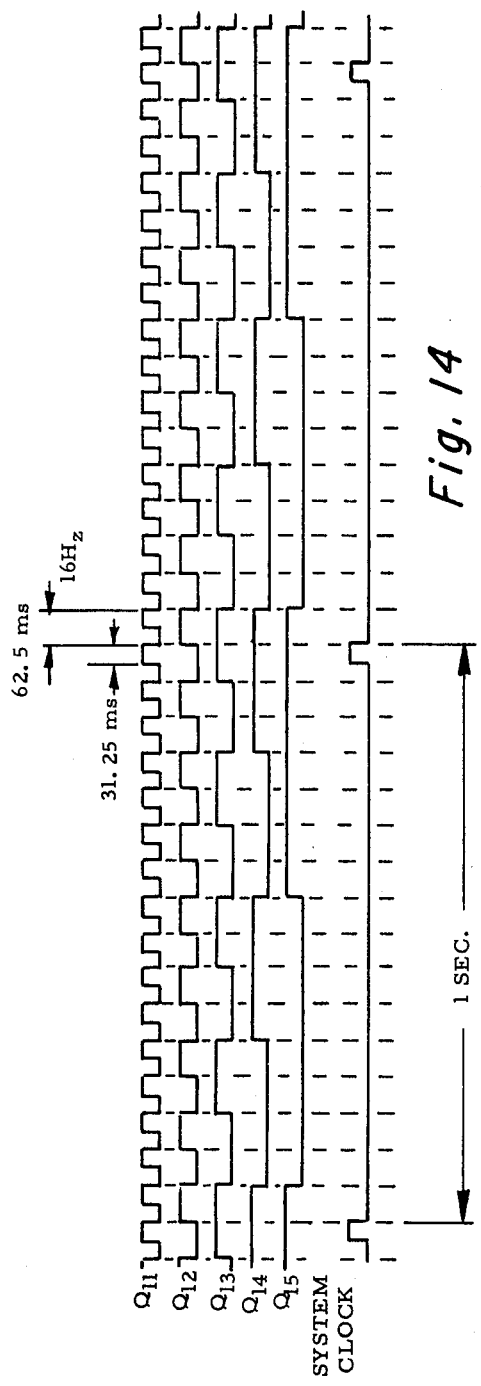
Fig. 13
Fig. 14

Fig. 15
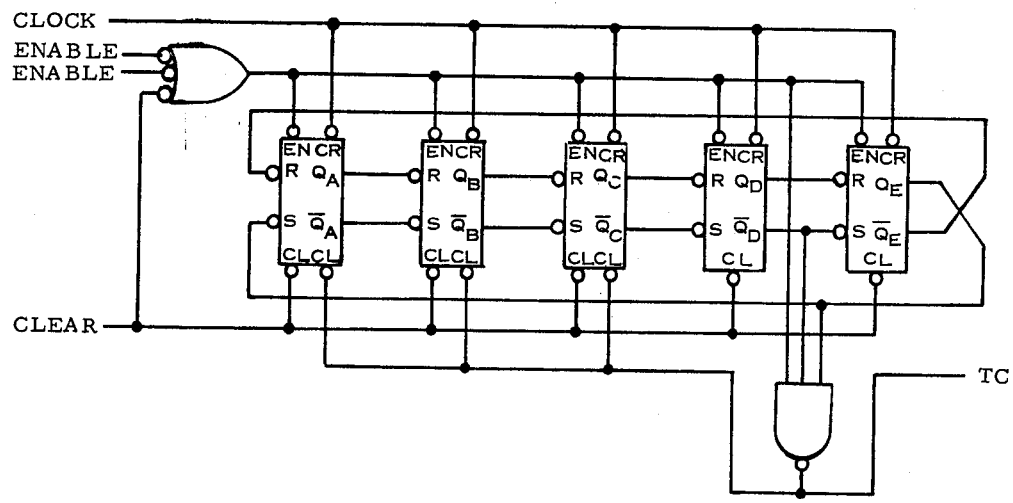
STATE DIAGRAM
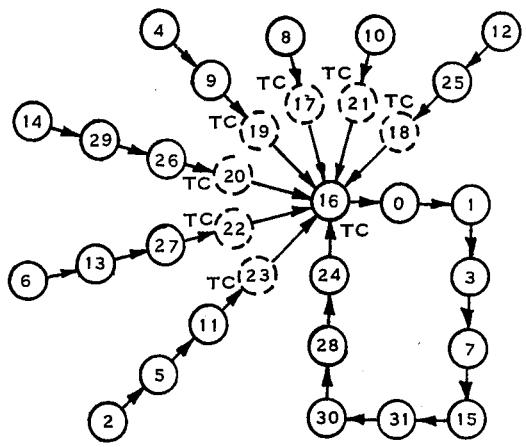
Fig. 16

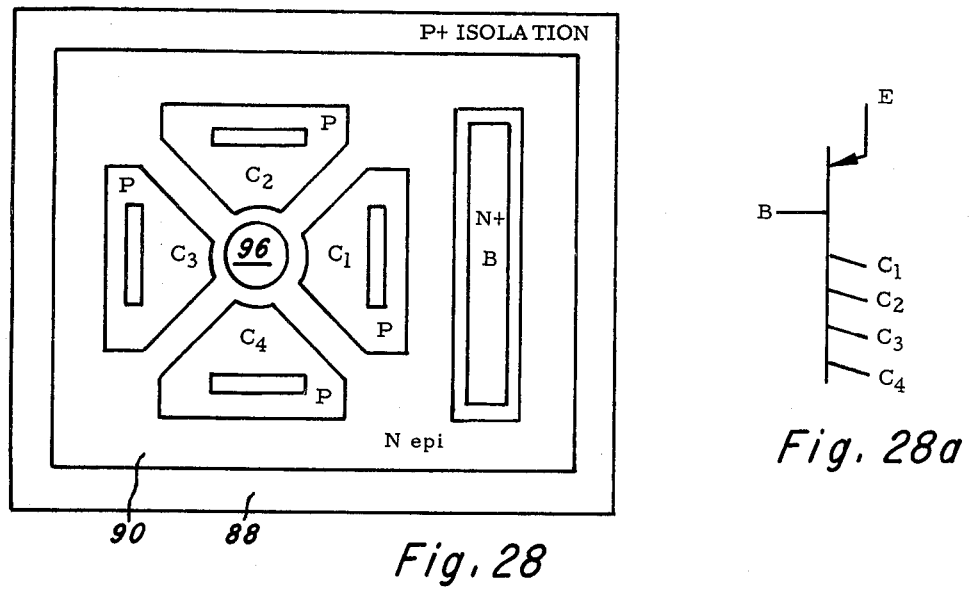
Fig. 28
Fig. 28a
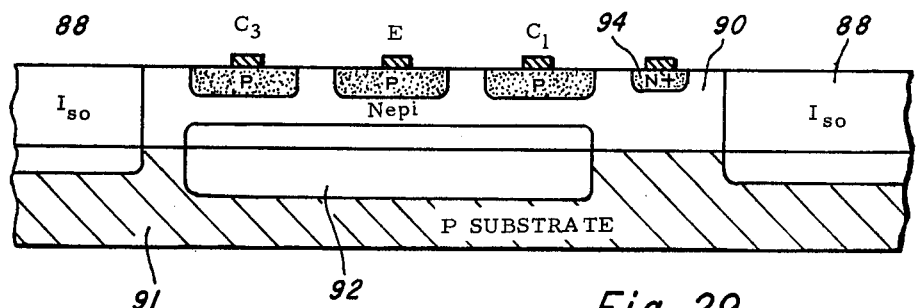
Fig. 29
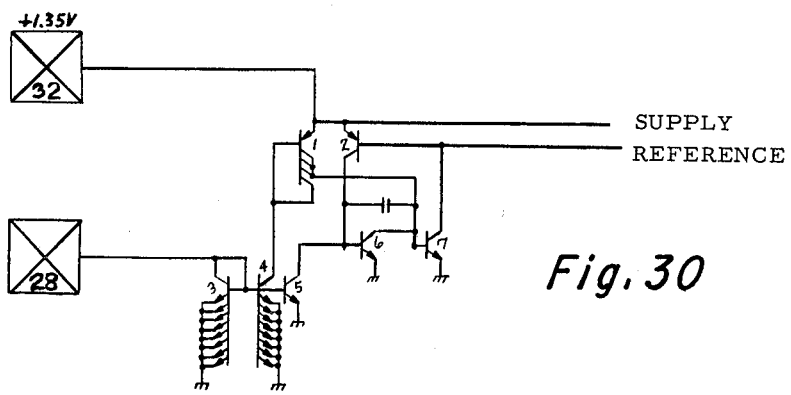
Fig. 30

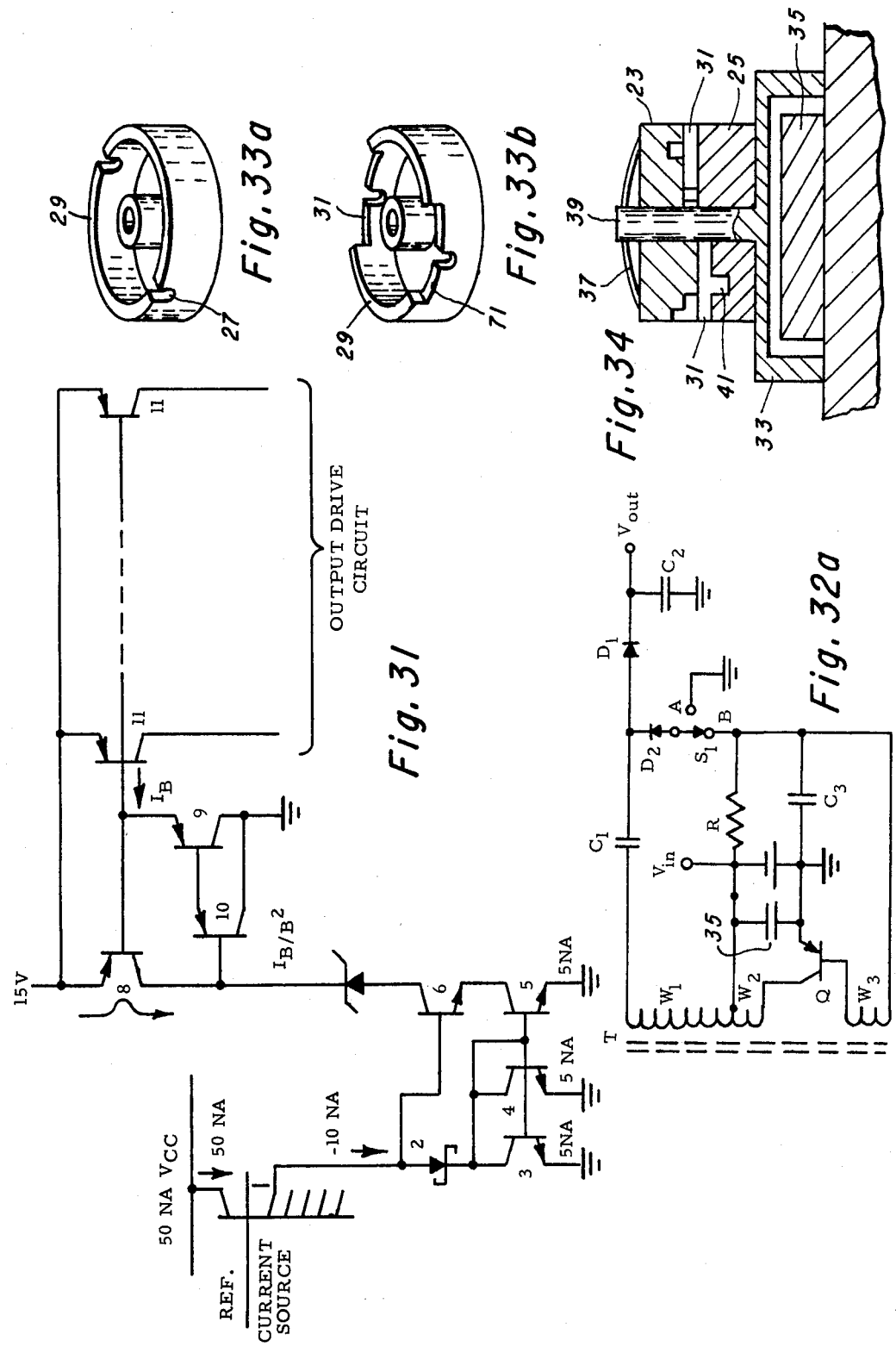

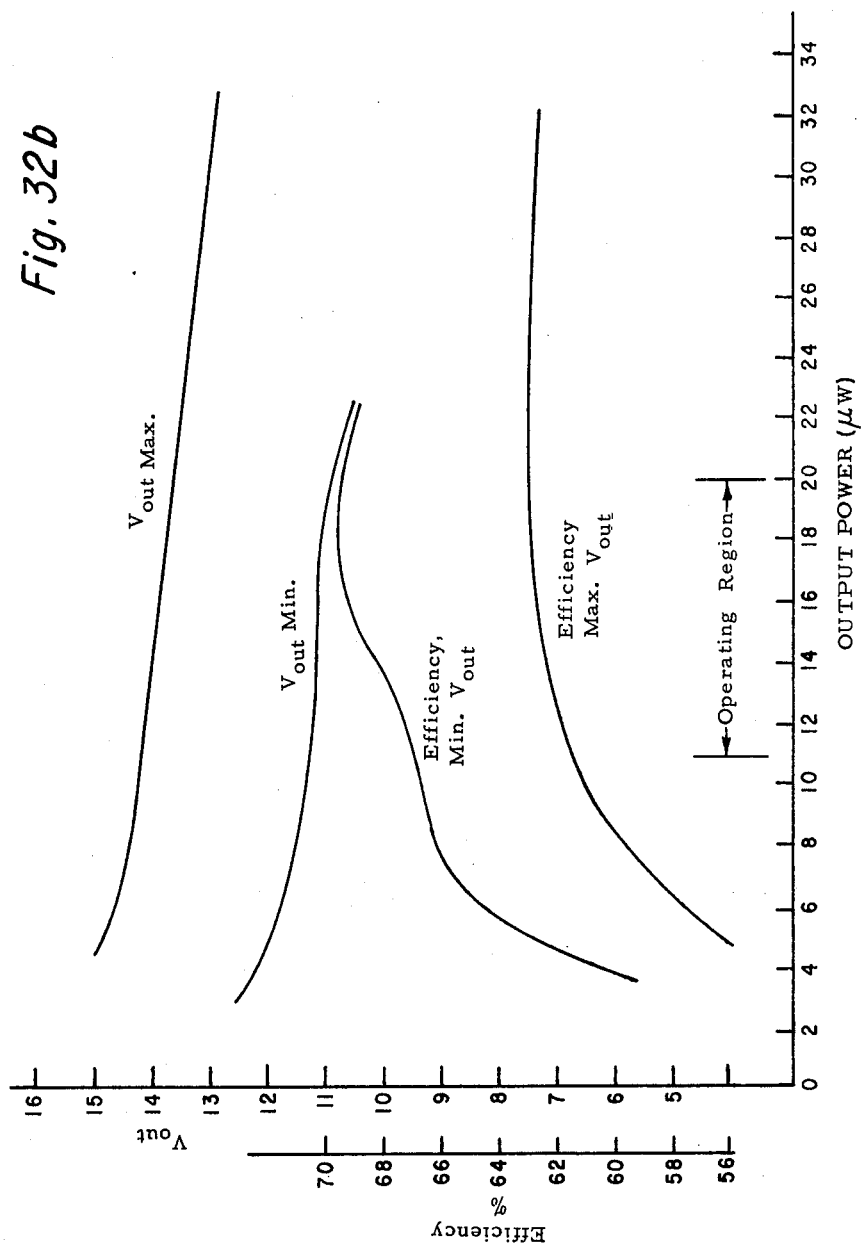

ELECTRONIC TIME KEEPING SYSTEM

This is a division, of application Ser. No. 264,212, filed June 19, 1972 which is now U.S. Pat. No. 3,886,726.

The present invention pertains to an electronic timekeeping devices in general and, more particularly, to an electronic wrist watch utilizing a liquid crystal display. A high frequency oscillator is utilized to develop the frequency standard. The frequency from the oscillator is divided using bipolar integrated circuit components effective to provide a one hertz system clock. Integrated circuit bipolar counters, decode and drive logic applies the drive enable signals to the liquid crystal display.

Low powered electronically controlled timekeeping devices have been described in the literature. For example, one such device is described in U.S. Pat. No. 3,560,998. It has also been suggested to utilize liquid crystal displays in a solid state watch. Reference for example U.S. Pat. No. 3,505,804. Numerous technical problems have been encountered, however, in attempting to provide a commercial electronic liquid crystal wrist watch. These problems include the difficulty of achieving sufficient liquid crystal lifetime when d.c. voltages are applied to the liquid crystal electrodes. At present, sufficient lifetime may be obtained using a.c. voltages but difficulty still persists with d.c. embodiments. Also, present electronic watches typically include only indication of hours, minutes, and seconds. It is difficult to provide a watch having a calendar that can easily be set; for example, to set back the time after the date has been incremented without again incrementing the date.

There have been proposals which suggest utilizing CMOS (complementary metal oxide semiconductor)-technology in combination with liquid crystal displays primarily due to the power savings capability of such a configuration Certain advantages, however, may be obtained utilizing bipolar technology for implementing the circuit logic; however, readily available battery sources provide on the order of 1 volt and it is exceedingly difficult to implement logic with bipolar integrated circuits using such voltage levels. Additional limitations are imposed due to integration requirements, these primarily being that it is difficult to obtain large resistances in integrated circuit format.

Accordingly, an object of the present invention is the provision of an electronically controlled timekeeping device having a liquid crystal display exhibiting adequate lifetime characteristics with conventional battery sources.

A further object of the invention is the provision of a timekeeping device which includes bipolar integrated circuit logic implementation operable from a one volt d.c. supply.

Yet another object of the invention is the provision of a timekeeping device having a liquid crystal display controlled by bipolar integrated circuitry wherein the display has provision for displaying the calendar date, including logic reset means to enable resetting time without incrementing the date.

Briefly, in accordance with the invention, a timekeeping device is provided which includes a battery operated bipolar integrated circuit for regulating display of the time, including means for displaying and independently setting the calendar date. A crystal controlled oscillator generates a master frequency. This frequency is applied to a frequency divider comprising a ripple counter of toggle flip-flops effective to produce a 1 hertz system clock signal. The toggle flip-flops respectively comprise bipolar transistors in a circuit configuration effective to operate from voltage sources which provide on the order of 1 volt. The system clock is applied to a series of counters and decode logic to effect generation to drive circuitry for application to a liquid crystal display. Circuit means are provided for producing current sources in lieu of high value external resistors. The current sources are independent of supply voltage fluctuations and load changes. A d.c. to d.c. convertor provides approximately 15 volts d.c. for activation of the liquid crystal material. The drive circuitry includes means for applying the voltage across the liquid crystal either "in phase" or "out of phase". In the preferred embodiment, a 32 hertz signal is obtained from the frequency divider state and is applied to the drive circuitry. In "out of phase" operation, a 32 hertz 15 volt square wave signal is applied across the liquid crystal, enhancing lifetime characteristics thereof.

Other objects and advantages of the invention will be apparent upon reading the following detailed description of illustrative embodiments in conjunction with the drawings wherein.

Figure 10A:
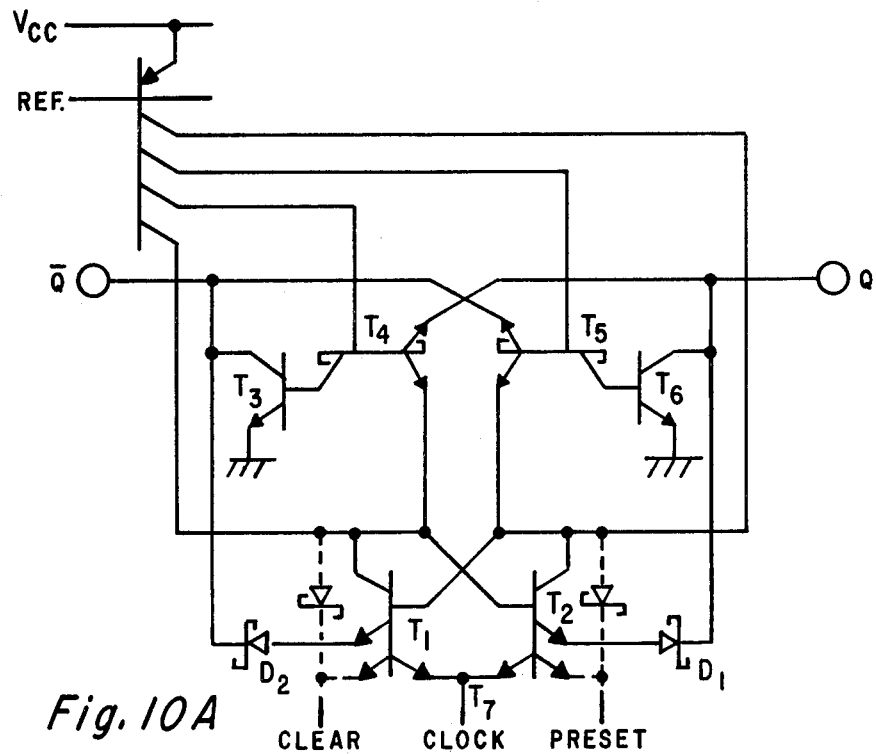
Figure 10B:
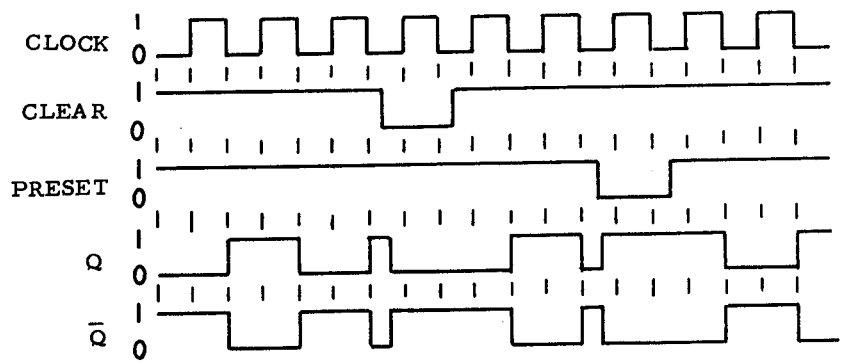
Figure 11:
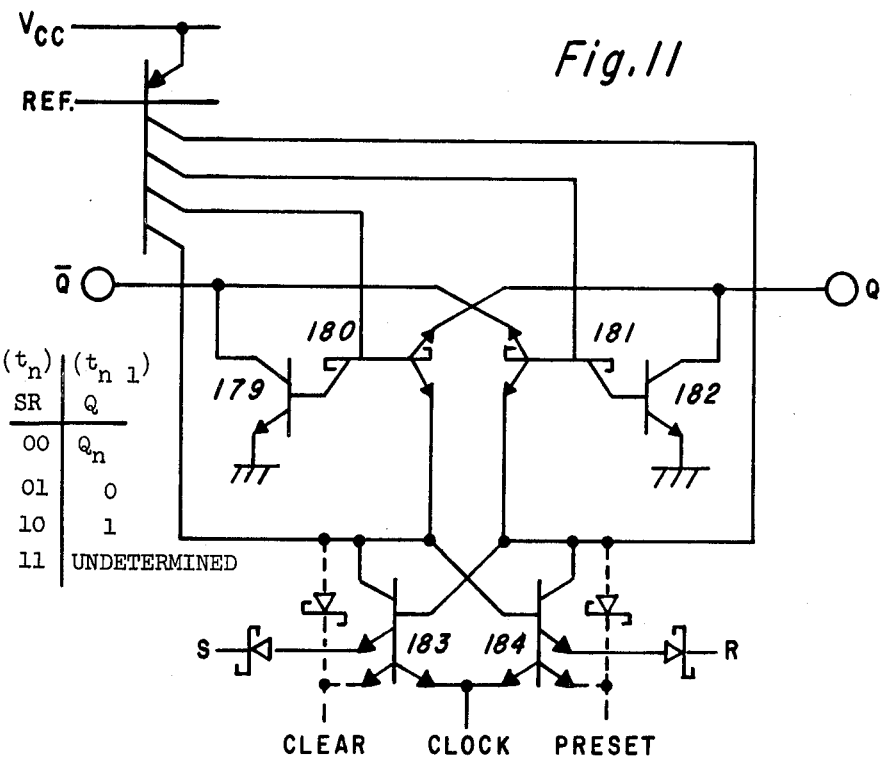
Figure 12:
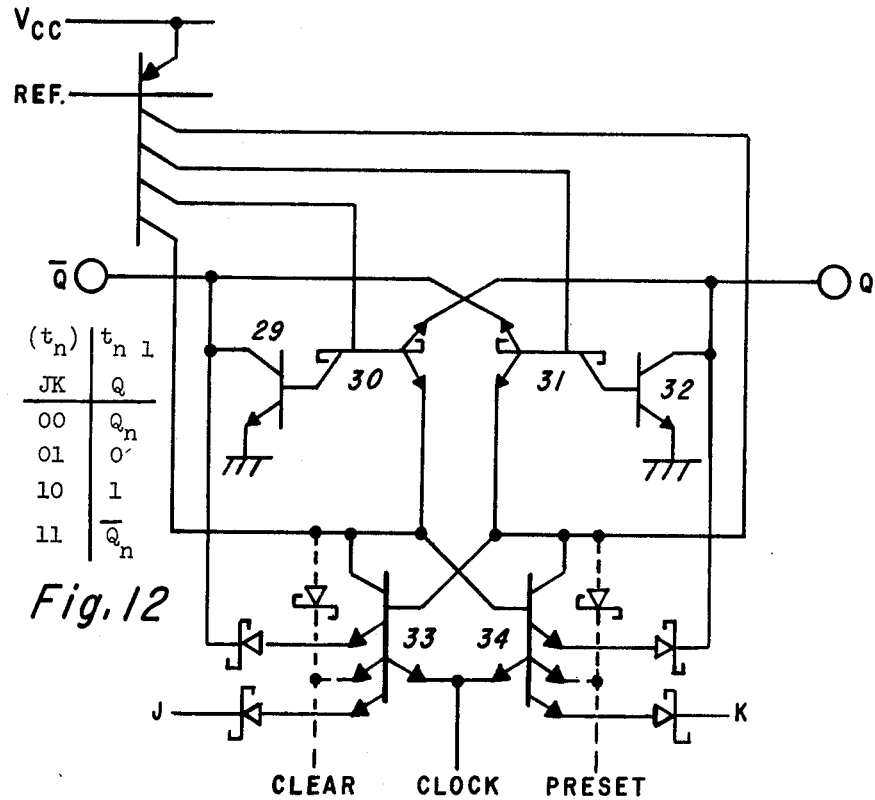
Figure 17A:
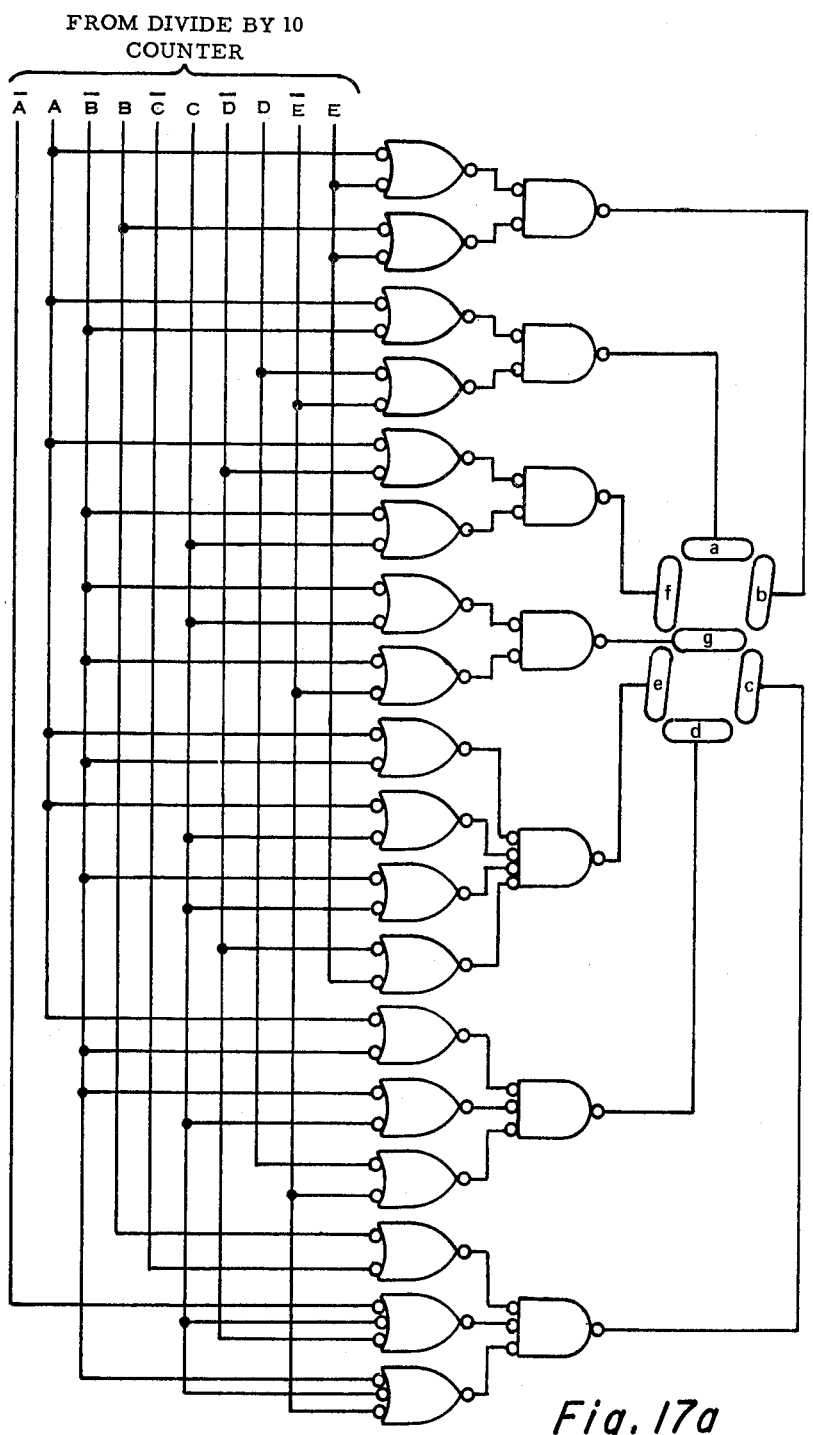
Figure 17B:
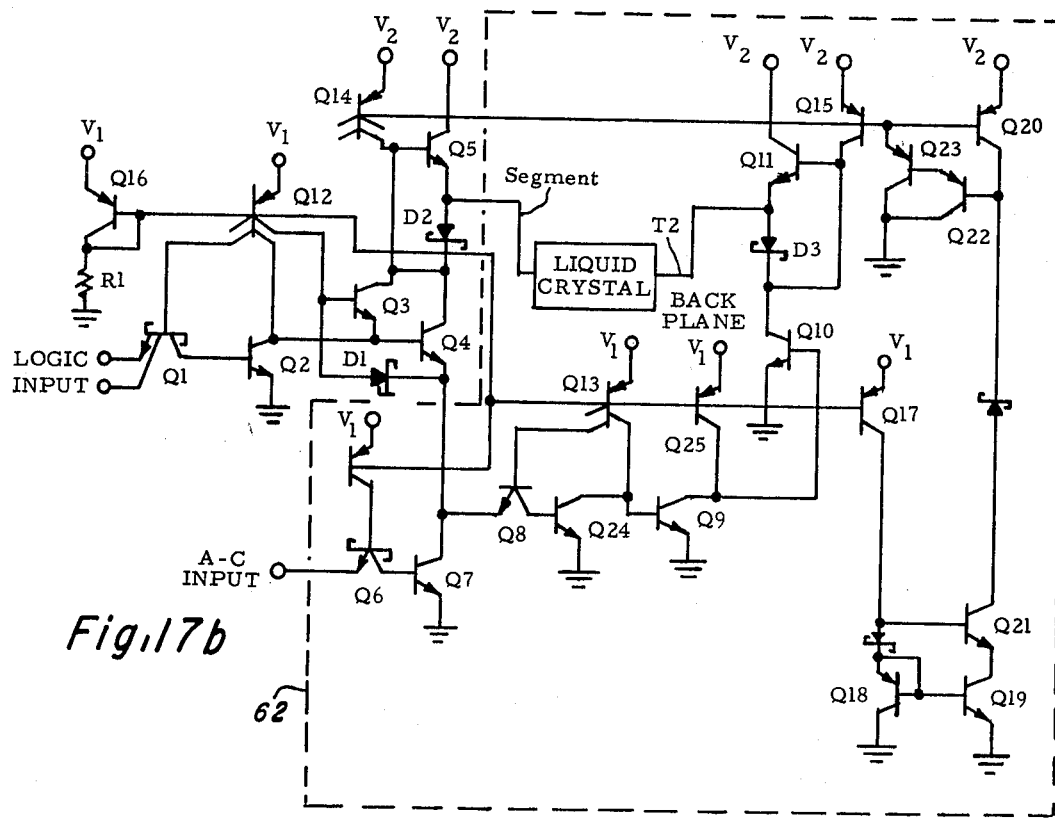
Figure 17C:
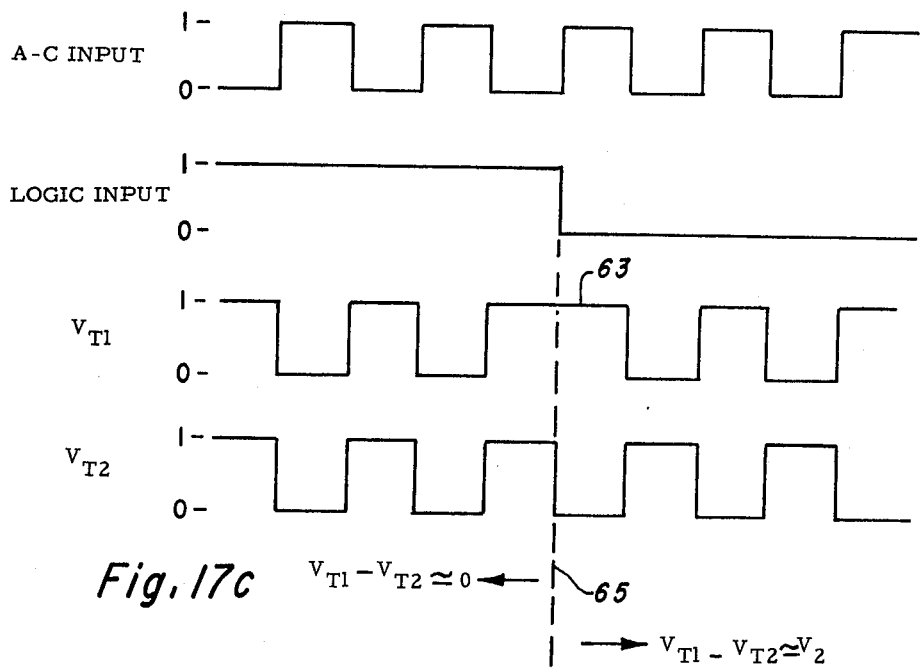
Figure 18:
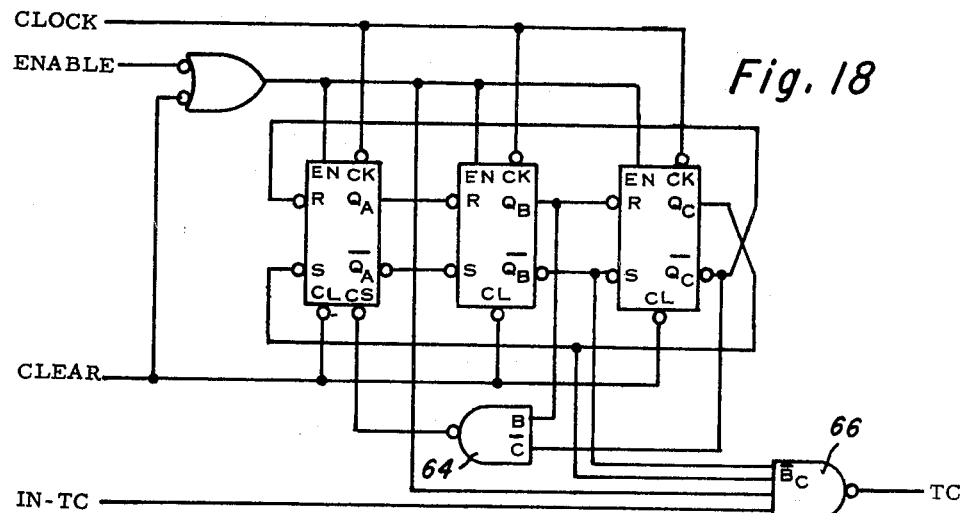
Figure 19:
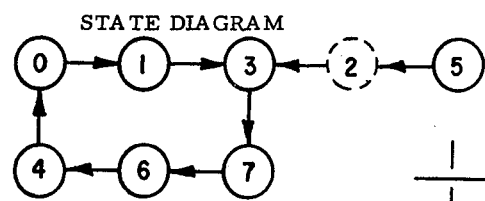
Figure 20:
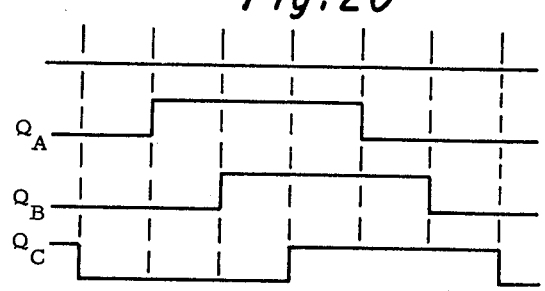
Figure 21:
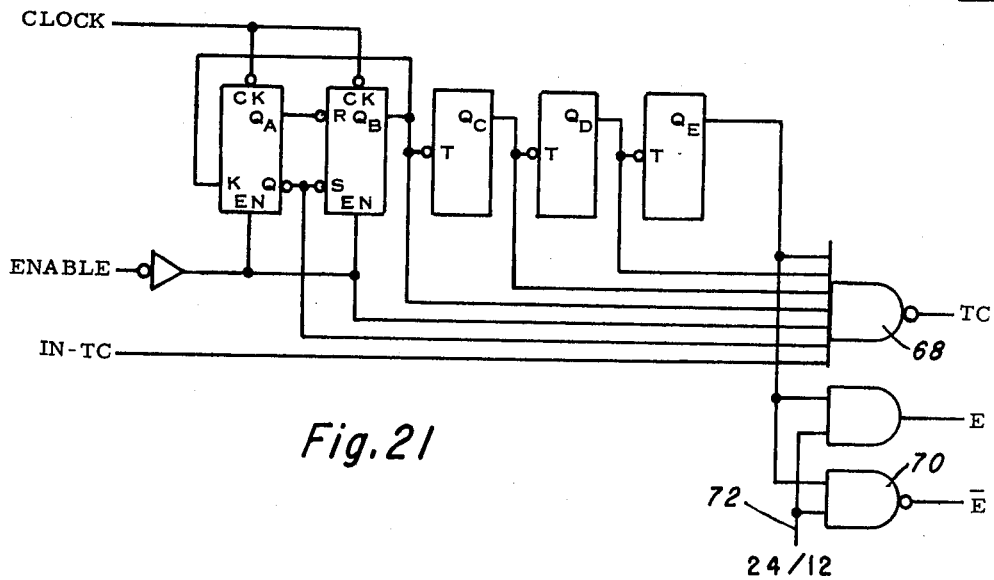
Figure 22:
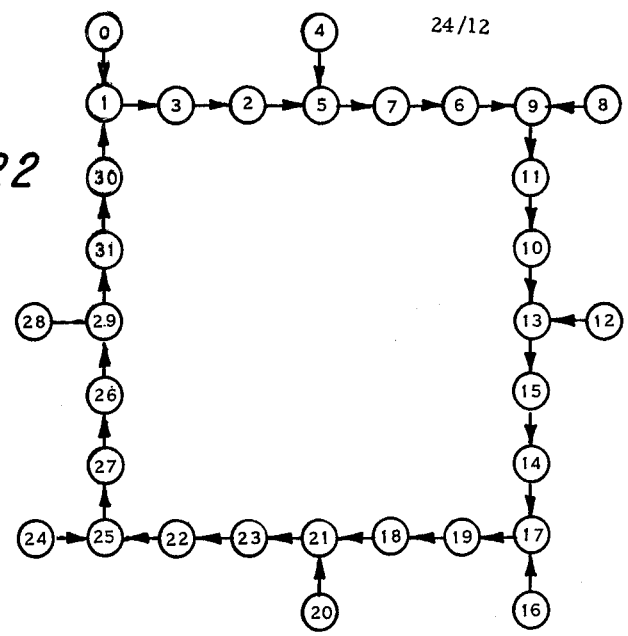
Figure 23:
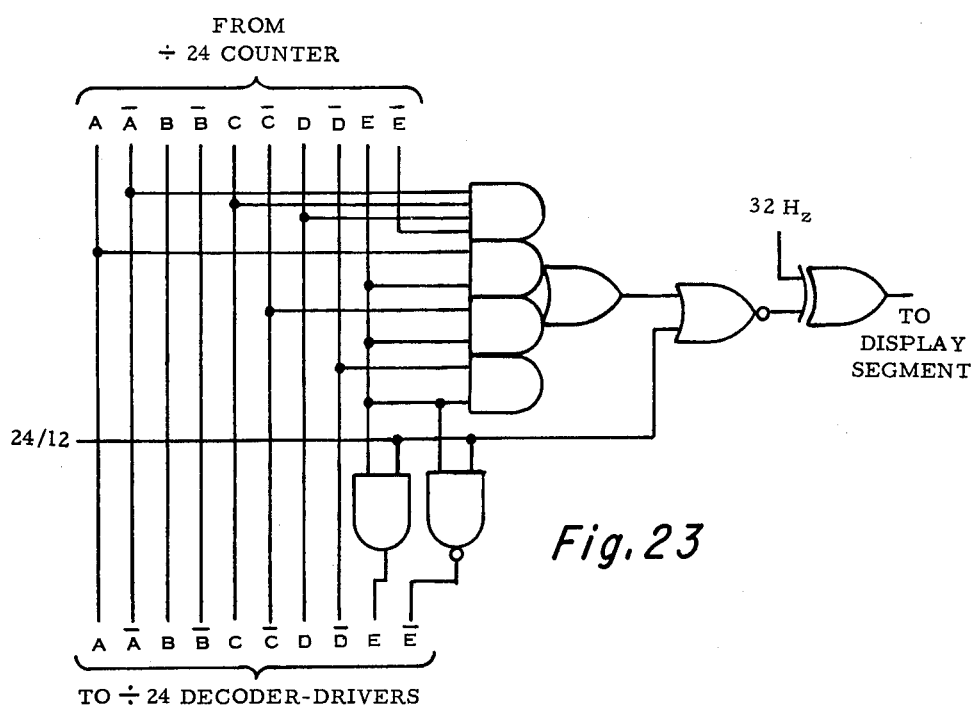
Figure 24:
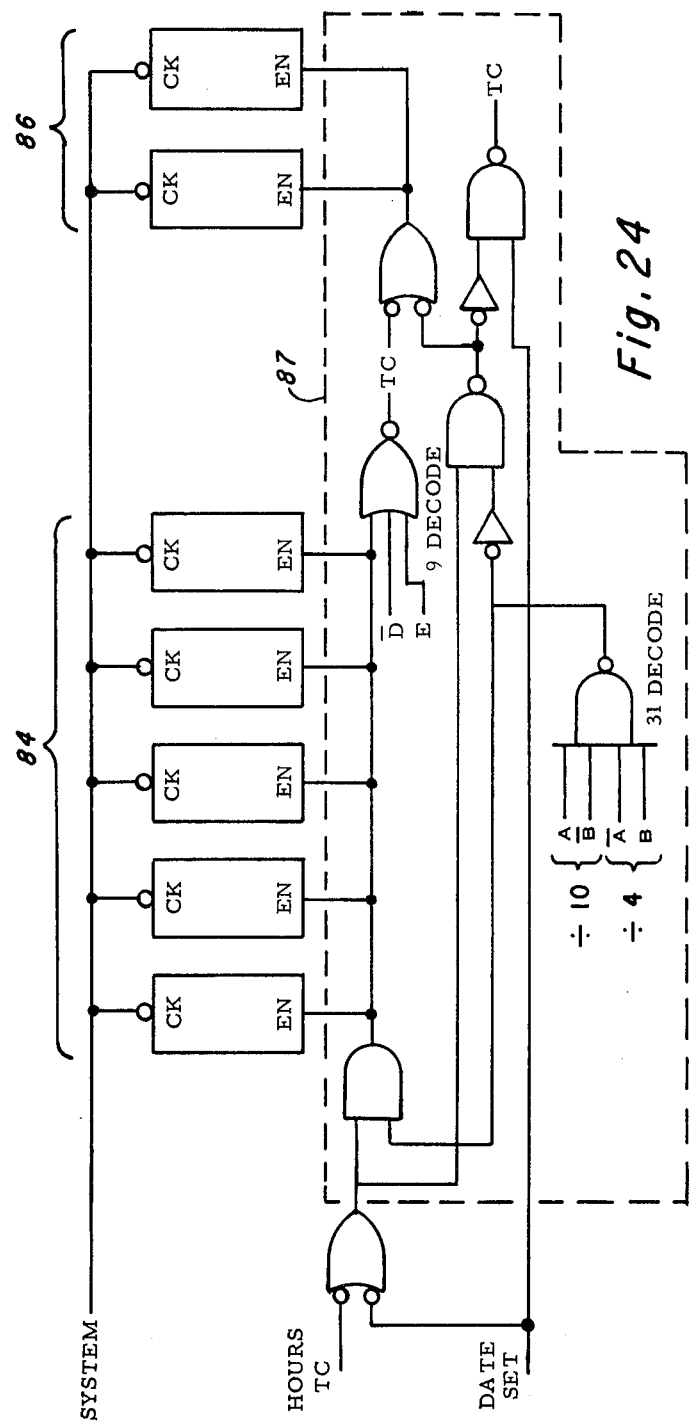
Figure 25:
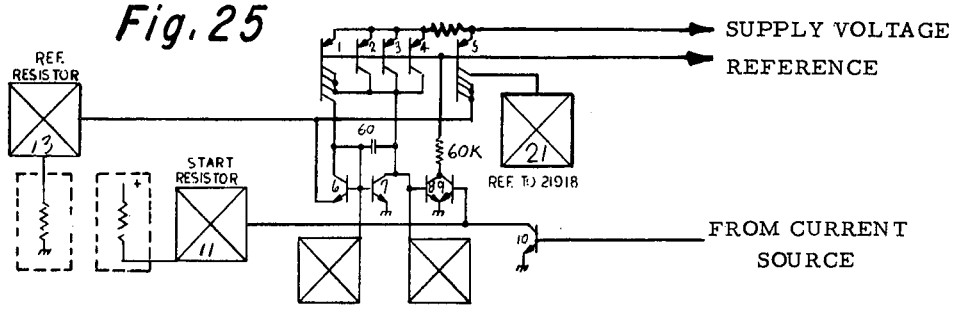
Figure 26:
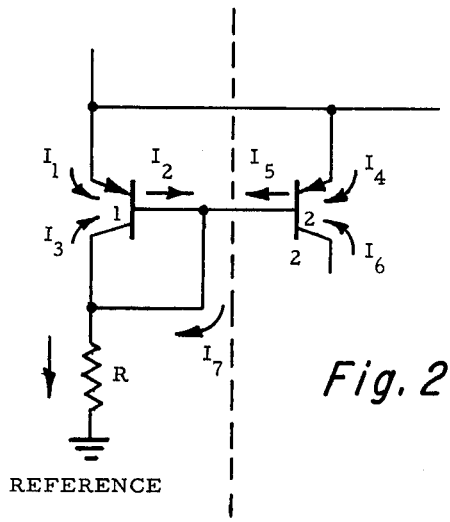
Figure 27:
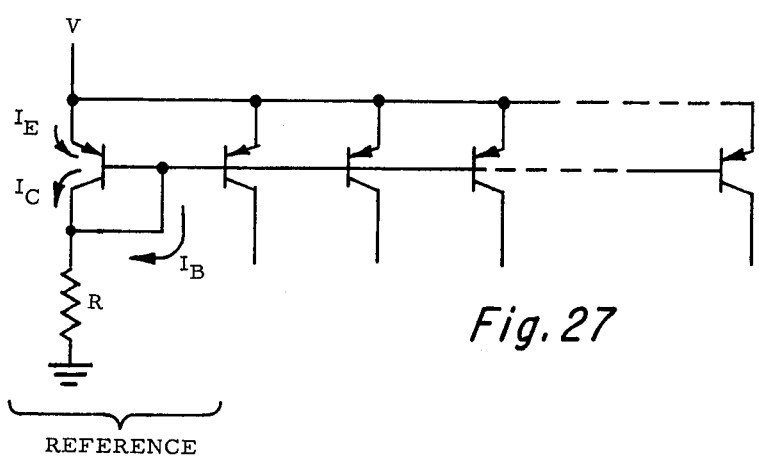

FIG. 10A schematically depicts a toggle flip-flop which may advantageously be used in accordance with the invention to implement generation of the one hertz clock signal;

FIG. 10B depicts the waveforms applied to the various terminals of the toggle flip-flop illustrated in FIG. 10A;

FIG. 11 schematically illustrates an RS flip-flop which may advantageously be utilized in accordance with the present invention;

FIG. 12 schematically illustrates a JK flip-flop which may advantageously be utilized in accordance with the invention;

FIG. 13 is a logic diagram of a ripple counter frequency divider;

FIG. 14 illustrates timing waveforms of the counter in FIG. 13;

FIG. 15 is a logic diagram of a divide-by-ten counter;

FIG. 16 is the state diagram of the counter in FIG. 15 which may be utilized in accordance with the invention;

FIG. 17A is a logic diagram of the units decoder for the divide-by-ten counter of FIG. 15;

FIG. 17B is a schematic diagram of the drive circuitry which may be utilized to energize the liquid crystal display of the present invention;

FIG. 17C depicts waveforms of the drive circuitry in FIG. 17B;

FIG. 18 is a logic diagram of a divide-by-six counter which may be used in accordance with the invention;

FIG. 19 is the state diagram of the divide-by-six counter illustrated in FIG. 18;

FIG. 20 illustrates typical waveforms of a divide-by-six counter such as illustrated in FIG. 18;

FIG. 21 is a logic diagram of a divide-by-twenty-four counter which may be utilized in accordance with the invention;

FIG. 22 is a state diagram of the divide-by-twenty-four counter illustrated in FIG. 21;

FIG. 23 illustrates the logic associated with the a.m.-p.m. indicator of the wrist watch in accordance with the present invention;

FIG. 24 is a logic diagram of a divide-by-thirty-one counter which may be utilized in accordance with the invention to display the calendar date;

FIG. 25 schematically illustrates a regulator in accordance with the present invention to insure that the constant current sources do not fluctuate;

FIG. 26 schematically illustrates a constant current source;

FIG. 27 schematically illustrates a plurality of current sources;

FIG. 28 is a plan view of a current source in accordance with the present invention;

FIG. 29 is a cross-sectional view of the current source illustrated in FIG. 28;

FIG. 30 schematically illustrates a slave regulator which may be utilized in accordance with the present invention;

FIG. 31 schematically illustrates a 15 volt regulator which may be used in accordance with the invention;

FIG. 32A schematically illustrates d.c. to d.c. convertor in accordance with the invention;

FIG. 32B depicts curve illustrating the voltage tuning range and efficiency of the convertor in FIG. 32A.

FIGS. 33A and 33B pictorially illustrates the transformer core of the d.c. to d.c. convertor schematically illustrated in FIGS. 32A and 32B.

FIG. 34 is a cross-sectional illustration of the d.c. to d.c. convertor transformer illustrated in FIGS. 32A and 32B.

With reference to the drawings, a detailed description of both the logic and the bipolar integrated circuit implementation thereof of the electronic wrist watch in accordance with the present invention will be given. The system will first be described by way of explaining how the various sections of the system functionally interrelate. The logic functions of the system which are implemented in integrated circuit format will then be described in detail with reference to FIGS. 6-9. Next, the various sections of the system will be described in detail including their bipolar integrated circuit implementation.

FUNCTIONAL DESCRIPTION

Figure 1:
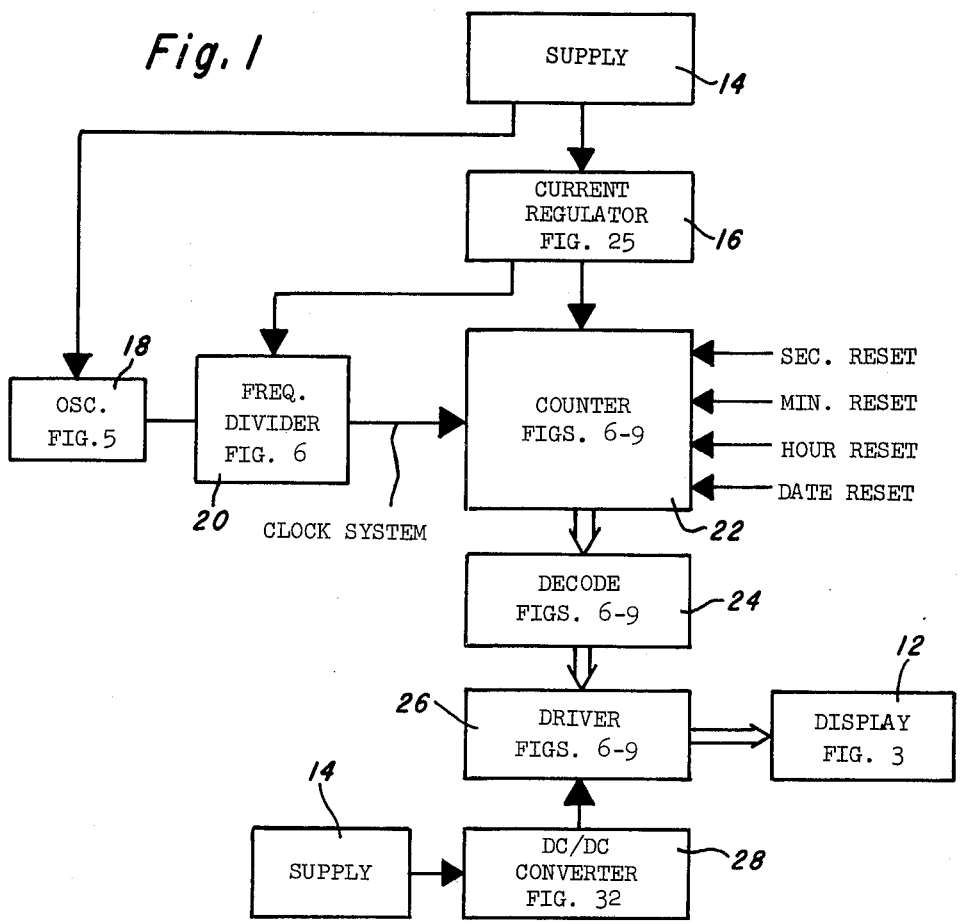
FIG. 1 is a functional block diagram of a solid state wrist watch in accordance with the invention.

With reference to FIG. 1, the elements of an electronic wrist watch in accordance with the present invention are illustrated generally at 10. The wrist watch includes a liquid crystal display 12. The display itself is described in greater detail with respect to FIG. 3. In accordance with the present invention, the display is effective to display not only the hours, minutes and seconds but also the calendar data. Logic means which will be described in greater detail hereinafter are provided which enable setting the time without incrementing the calendar date. The wrist watch operates from a voltage supply 14 which is a commerically available d.c. battery. The logic circuitry of the wrist watch is configured such that it is operable with a voltage supply on the order of one volt, which corresponds to that which may typically be produced by conventional battery sources. A regulator 16 is connected to the logic circuitry and insures that a constant current source is provided to this circuitry regardless of variations in source supply 14 or in load variations. A crystal controlled oscillator 18 receives power from the supply 14. The oscillator 18, which provides a 32.768 KHz signal, is described in greater detail with respect to FIG. 5. This signal is applied to the frequency divider 20.

The frequency divider 20 is a ripple counter having 15 successive toggle flip-flops; the output of the last flip-flop in the chain produces a one hertz signal. The system clock output from the frequency divider 20 is applied to a series of counters shown generally at 22. These counters are described in greater detail with reference to the description of FIGS. 6-9. In general, the counters are effective to produce signals respectively for the second, minutes, hours and calendar date. Logic means are connected to the counter for resetting the seconds, minutes, hours and date. The output of the counters 22 is applied to decode circuitry shown generally at 24. The decode circuitry in turn provides a signal to driver circuitry 26 which provides an output to the liquid crystal display 12. A voltage on the order of 15 volts d.c. is coupled to the display through the driver circuitry 26 from the d.c. to d.c. convertor 28. The d.c. to d.c. convertor is described in greater detail with reference to FIG. 32A and 32B.

In operation, the ripple counter 20 may be characterized as asynchronous in that a signal "ripples" through the 15 successive flip-flop stages. The counter 20 provides a one hertz output signal which is applied to the respective counters in the circuitry. Operation of the counters is synchronous in that the one hertz signal is simultaneously applied to all of the various counters which are utilized to generate the seconds, hours, minutes and calendar date information. Each display character of the display 12 is preferably characterized by a 7 segment arrangement of electrodes, providing a digital display.

Figure 2:
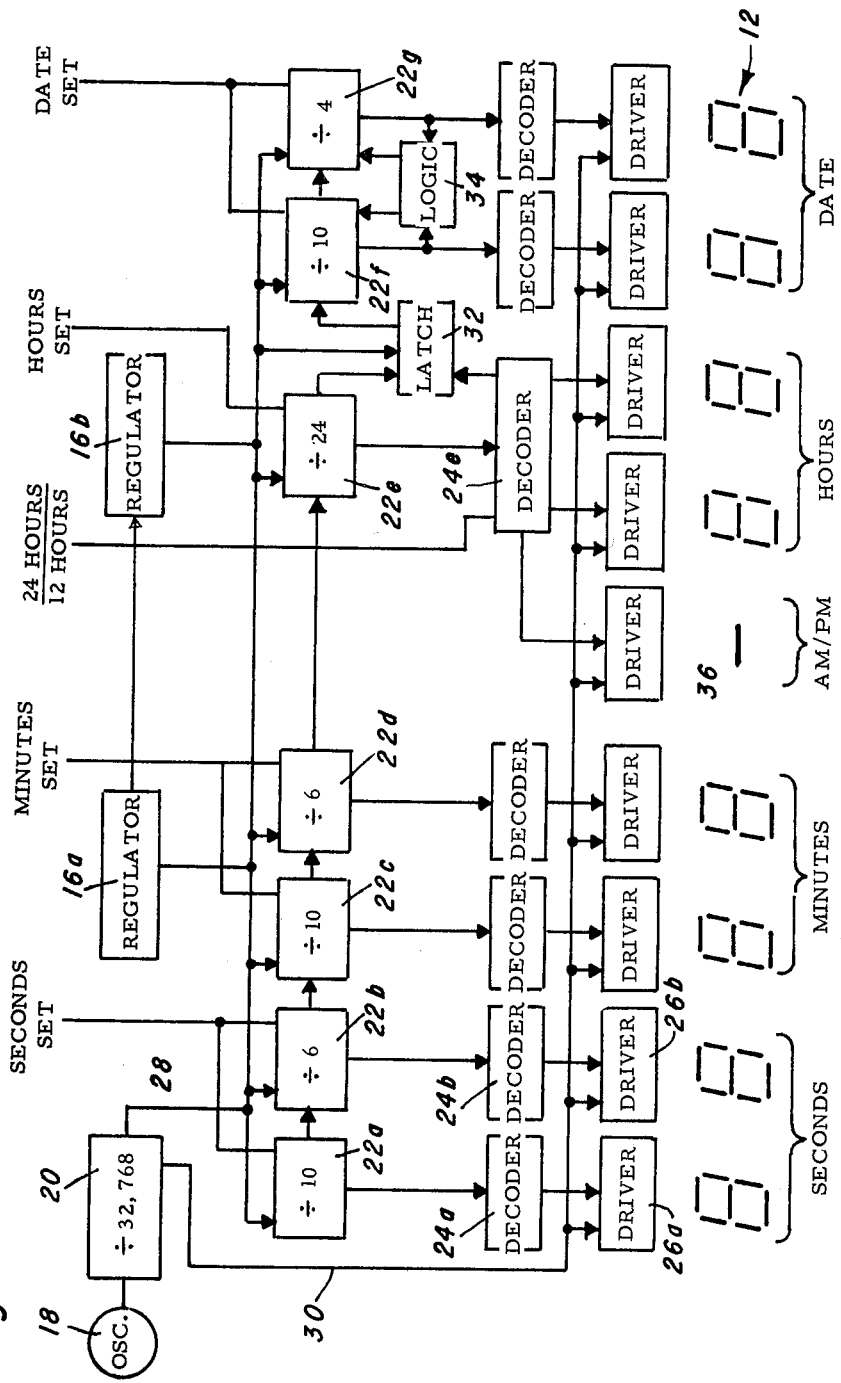
FIG. 2 is a functional block diagram of an embodiment of the solid state watch illustrating the associated display functions.

With reference to FIG. 2, the basic elements of the present electronic system that are defined on integrated circuits are illustrated in block diagram. The output of the crystal controlled oscillator is applied as an input to the 15 stage ripple counter 20 which divides the signal by 32,768. The ripple counter 20 has two outputs, a one hertz system clock 28 which is applied to all counters shown generally at 22 and a 32 hertz signal 30 which is applied as an input to all the driver sections shown generally at 26.

In operation, display of the seconds is effected by a divide-by-ten section 22A, which increments once each time a system clock pulse 28 is received, and a divide-by-six section 22B. The divide-by-six counter increments in response to a clock pulse only after counter 22A has reached its maximum count. The counters 22A and 22B define a divide-by-sixty counter providing a signal for the seconds. The output of each counter 22A and 22B form an input to a corresponding decoder 24A and 24B. The output of each decoder is applied through a driver section 26A or 26B to effect display of the proper numerals corresponding to the state of the counters 22A and 22B.

Similarly, divide-by-ten and divide-by-six counters 22C and 22D define the divide-by-sixty requirement for display of minutes. These counters also have decoders and drivers coupled to the liquid crystal display shown generally at 12. The minutes and seconds counters have provision for independently setting the display state thereof.

When counters 22A-22D are at their maximum count an enable signal is applied to the divide-by-twenty-four counter 22E (which defines the "hours" counter) enabling it to increment once. The output of counter 22E is applied to a latch 32 and to the decoder 24E. The latch 32 is set to a preselected state responsive to the hours counter 22E enabling incrementation of the date counter 22F and 22G. The output of the decoder 24E is applied to drivers 26 in order to display both hours and a.m. or p.m. indication.

The hours counter 22E is followed by divide-by-ten and divide-by-four counters 22F and 22G. These counters are connected to logic 34 so as to define a divide-by-thirty-one counter. This is the counter for storing information relative to the date. The output of counters 22F and 22G is applied through decoders 24 and drivers 26 to the segments of the liquid crystal display. Both the hours counter 22E and the date counter 22F and 22G have provisions for independently setting the hours and for setting the date. The decoder 24E of the hours includes means for effecting display in either a 12 hour display format or a 24 hour display format. The a.m./p.m. indicator 36 indicates a.m. or p.m. information only in the 12 hour display mode. In the 24 hour display mode, the electrode 36 is continuously energized.

The regulator 16A is the system master regulator and in the illustrated two-chip embodiment is connected to slave regulator 16B. That is, as illustrated in FIG. 2, the seconds and minutes counters, decoders, and drivers are defined on one integrated circuit chip while the remaining circuitry is on a second integrated circuit chip. Since device paramemters may vary from chip to chip, a master/slave regulator system is provided.

Figure 3:
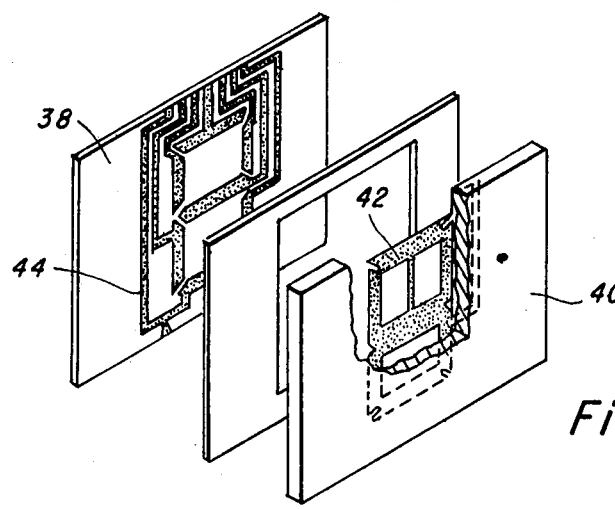
FIG. 3 is a pictorial illustration of a portion of a liquid crystal display cell.

With reference to FIG. 3, a portion of a display cell referenced generally at 12 in FIG. 2 is illustrated. As may be seen, the liquid crystal cell comprises a sandwich structure of two glass plates 38 and 40. The facing portions of the two glass substrates 38 and 40 have transparent electrode patterns referenced generally at 42 which may be electrically contacted by transparent interconnection path 44. By way of example, the transparent electrodes and interconnect patterns may comprise tin oxide. As illustrated, the two glass substrates 38 and 40 are separated a predetermined distance by a spacer 46. This spacer, by way of example, may comprise teflon and may be on the order of one mil in thickness. The central portion of the spacer 46 defines an aperture which houses the liquid crystal composition. The sandwich structure may be sealed either by mechanically clamping the plates together or by using an epoxy bond. Liquid crystal display cells are wellknown in the art and detailed description of the mode of operation and methods for fabricating such cells is not required herein.

Figures 4, 5:
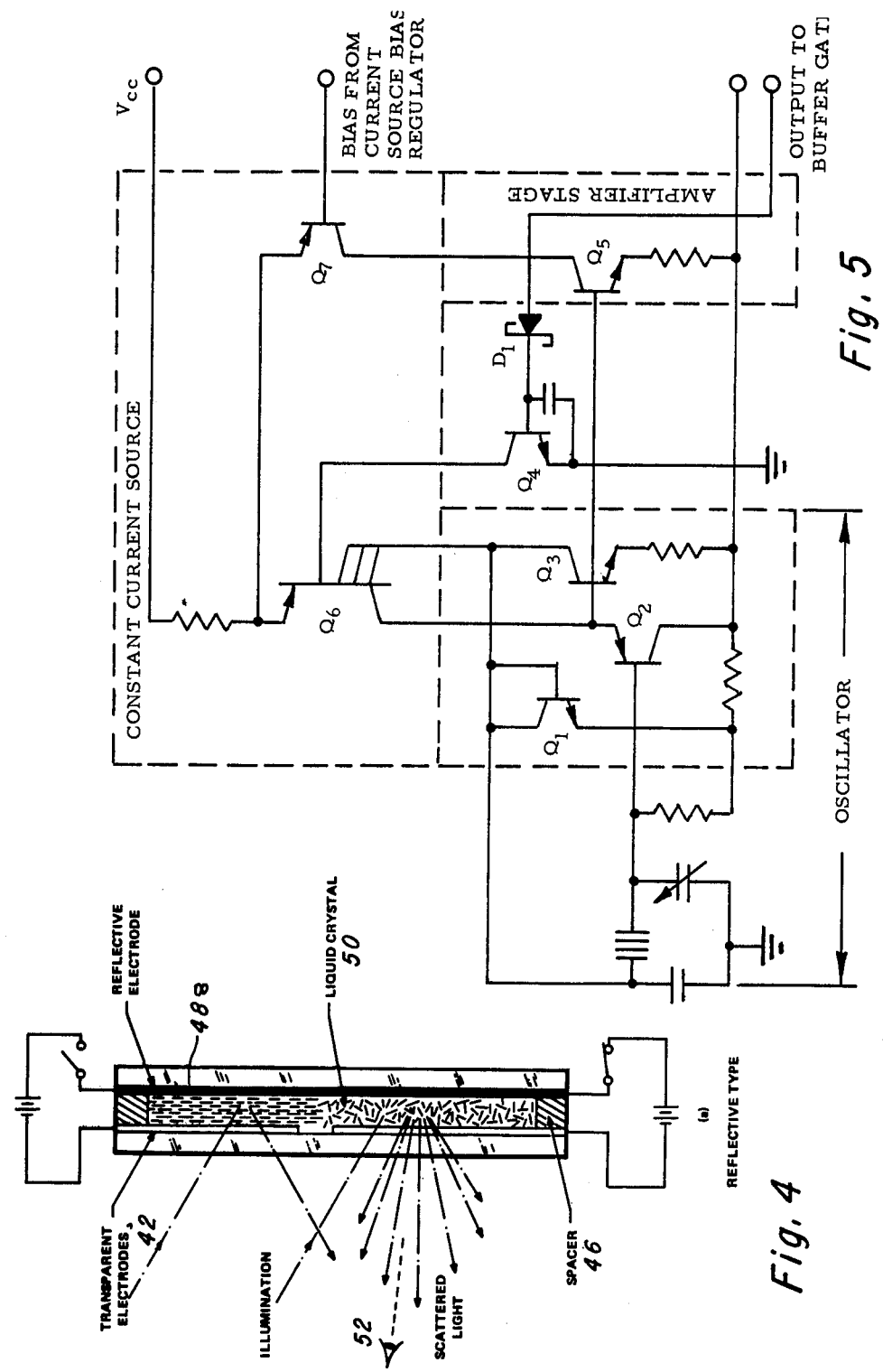
FIG. 4 is a diagrammatical illustration in cross-section of the display cell of FIG. 3 illustrating the reflective mode of operation.
FIG. 5 is a schematic diagram of an oscillator circuit in accordance with the invention.
Figure 6:
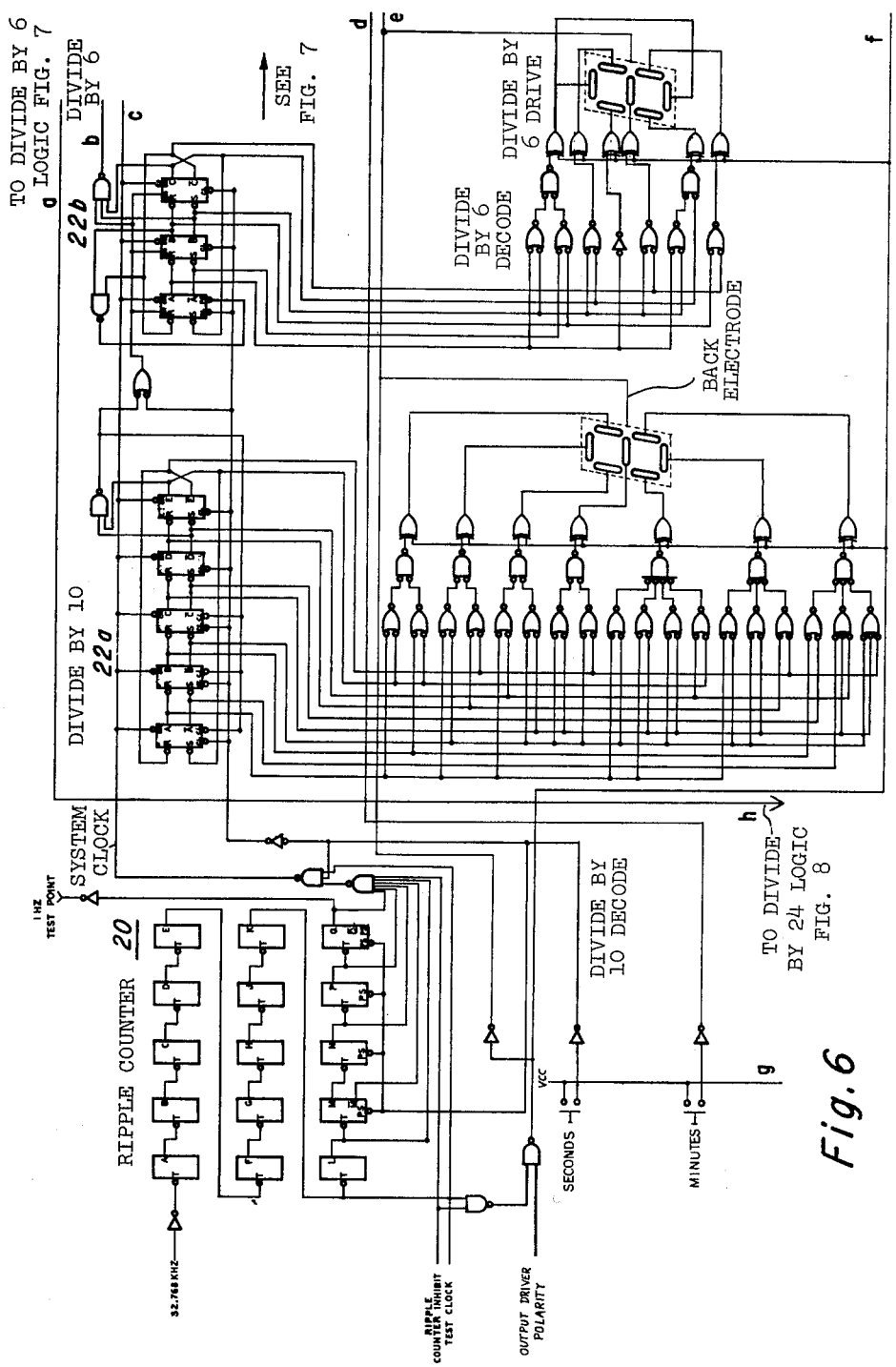
FIGS. 6 – 9 depict the detailed logic of an electronic wrist watch in accordance with the invention, which logic is implemented by bipolar integrated circuit configurations.
Figure 7:
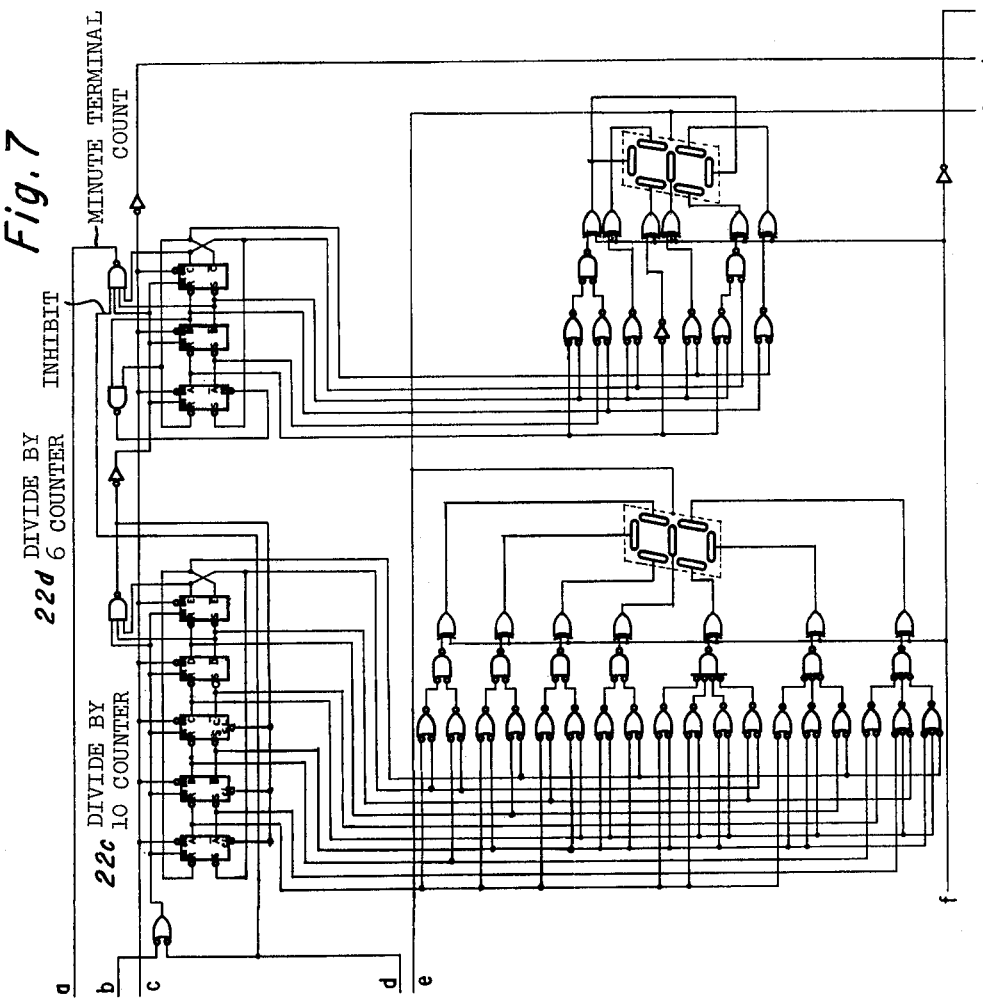
Figure 8:
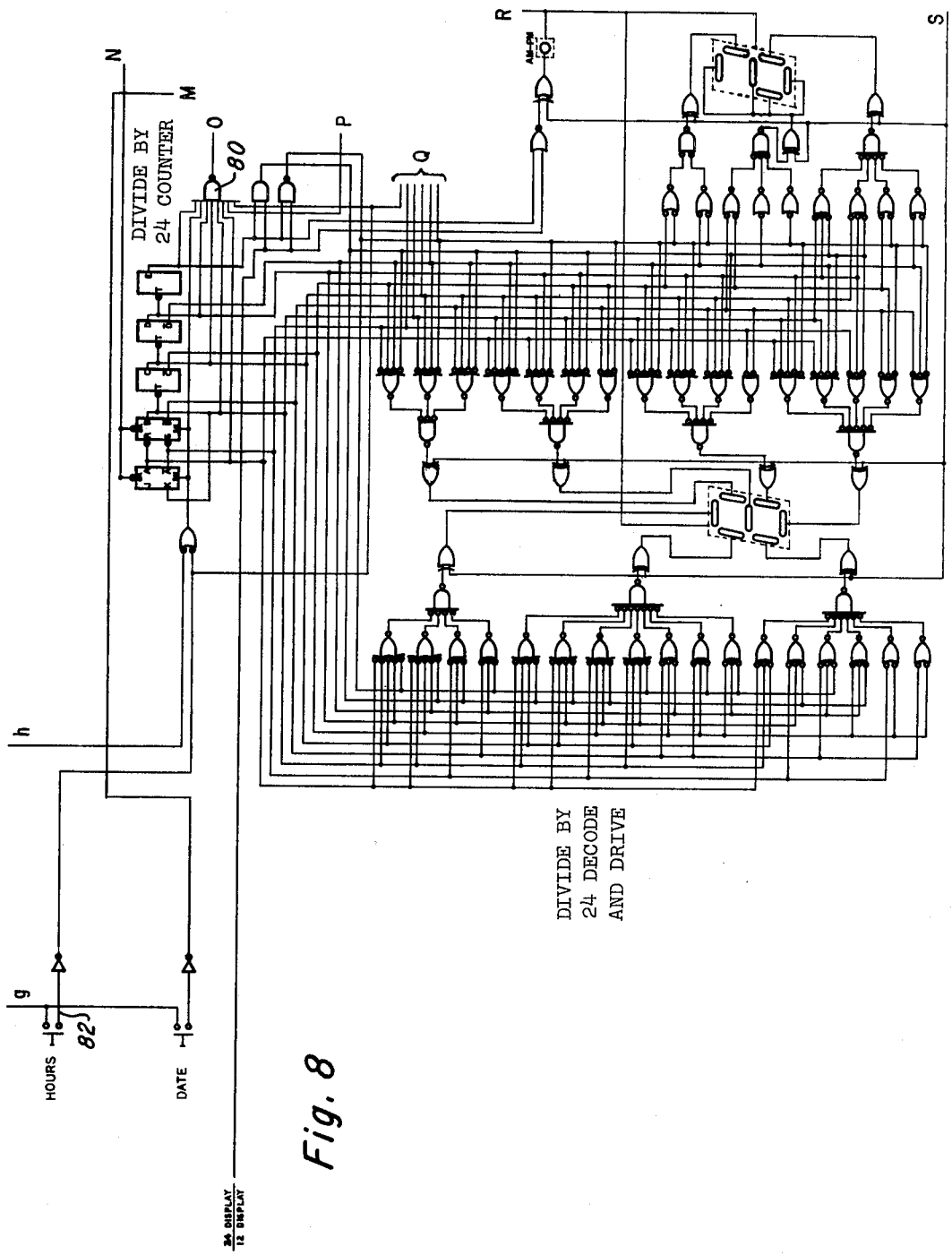

As is well-known in the art, liquid crystal display cells may be operated in either the reflective or transmissive modes. In accordance with the present invention it is preferred to form an electronic wrist watch utilizing a liquid crystal display which operates in the reflective mode. Such a cell is schematically illustrated in cross-section in FIG. 4. In the reflective mode of operation, the rear electrode 48 may be defined to be reflective. If desired, however, the rear electrode pattern may remain transparent and a highly reflective layer placed on the back side of the rear electrode. The reflective mode of operation is advantageous in that ambient lighting conditions may be utilized to effect the display. As illustrated in FIG. 4, in the region of the liquid crystal material 50 across which a voltage is impressed dynamic scattering occurs and ambient light is reflected from the reflective electrode back toward a viewer 52. In the region of the display cell where a voltage is not impressed across the liquid crystal composition, ambient light is transmitted through the liquid crystal composition unscattered and is reflected by the reflective electrode away from the viewer 52.

Suitable liquid crystal compositions for use at relatively low d.c. and a.c. voltages are well-known in the art and need not be explained in detail herein. At this juncture it may be noted that to date great difficulty is experienced in operating liquid crystal compositions with d.c. voltages for long periods of time. On the other hand, relatively long operating lifetimes can be expected when a time varying voltage is applied across the composition.

OSCILLATOR DESCRIPTION

With reference to FIG. 5, there is schematically illustrated an oscillator/amplifier which includes complementary emitter-follower circuitry and an amplifier having constant current source pullups and bias stabilization feedback loops. This oscillator configuration is extremely advantageous in the system of the present invention in that a supply voltage at or below one volt may be utilized. Further, the constant current source provision of the oscillator amplifier circuit enables forming the circuitry in integrated format since large value load or pullup resistors are not required.

The oscillator includes a two transistor amplifier comprising transistors Q2 and Q3. The emitter-follower p-n-p transistor Q2 provides a high input impedance so that the circuit will operate over a wide frequency tuning range. As thus configured, the oscillator amplifier circuitry provides a significant advantage over conventional single transistor amplifier circuits. The complementary arrangement of the emitter-follower configuration enables operation, from a supply voltage below 1.0 volts, an advantage not obtainable with conventional type oscillator circuits. A constant current source Q6 enables elimination of the requirement of large value load or pullup resistors which cannot be made satisfactorily in integrated form within the constraints imposed by the electronic wrist watch of the present invention. The amplifier Q5 receives a bias signal from the emitter of Q2 and the collector bias current for transistor Q5 is supplied from the current source Q7. Since both the oscillator transistor and the amplifier transistor must be biased for linear operation, bias stabilization feedback circuits are utilized. Bias stabilization for the oscillator is provided by feedback from the collector of transistor Q3 through the diode connected transistor Q1 to the base of Q2. This feedback holds the collector voltage of transistor Q3 at a value which is slightly higher than the base-emitter voltage of transistor Q1. The total collector current supplied to the oscillator by current source Q6 is determined by the voltage feedback from the collector of transistor Q5. The collector current of transistor Q5 is furnished by the current source Q7 being biased on by the current source bias regulator (not shown). When the current is first turned on, only transistor Q7 conducts so that the collector of transistor Q5 rises in voltage until diode D1 and transistor Q4 conduct. Then the collector current of transistor Q4 turns on transistor Q6 to a current magnitude which supplies the correct bias so that transistor Q5 conducts just enough that its collector voltage maintains diode D1 and transistor Q4 in very slight conduction at the most positive pack of each cycle of the oscillator'output. In this manner, the circuit is maintained in stable bias operation and its output is held in the limits defined by the forward drop of the base-emitter voltage of transistor Q4 in series with the forward drop of Schottky diode D1 (which is a total drop of about 0.85 volts) at the lower voltage limited by the saturation voltage of transistor Q5.

INTEGRATED CIRCUIT LOGIC IMPLEMENTATION

With reference to FIGS. 6–9, there is illustrated in logic diagram format the integrated circuit function of the electronic wrist watch in accordance with the present invention. This logic implements the functions depicted in the functional block diagram of FIG. 2, and the reference numerals used in FIG. 2 are utilized as applicable to detail logic blocks in FIGS. 6–9. The logic and manner of operation of the various logic blocks in FIGS. 6–9 will now be described in detail.

Prior to beginning discussion of the logic implementation in accordance with the present invention, it would be beneficial first to describe operation of three of the bipolar flip-flop configurations utilized in the logic implementation. The three types of flip-flops are the toggle, the RS, and the JK flip-flop.

First, operation of the toggle flip-flop will be described. With reference to FIGS. 10A and 10B, the toggle flip-flop comprises a bipolar masterslave floating master d.c. coupled flip-flop. Conventional bipolar flip-flops for low voltage application are a.c. coupled. In the present system, however, where operation is required in the one volt supply range, it was not possible to construct a standard d.c. coupled circuit since two base-emitter junctions plus a current source could not be fitted into the one volt supply. Further, the one volt supply limitation precludes a flip-flop configuration which includes a base-emitter junction, a base-collector junction and a current source. The flip-flop in accordance with the present invention utilizes a Schottky clamped base-collector junction and at the operating current level utilized, a current source, a base-collector junction with a Schottky clamp and a base-emitter voltage are fitted into the one volt supply limitation.

With reference to the toggle flip-flop, transistors T1 and T2 define the master of the flip-flop while transistors T3, T4, T5 and T6 define the slave. In operation, assume that transistor T6 is biased in the on condition such that its collector is close to ground, receiving current through the crosscoupling from one of the emitters on Schottky transistor T4. Therefore, no base drive current is available for transistor T3 and therefore the collector of T3 is in the high state since T3 is biased off. Now assume that the clock, clocking transistor T7, is off. In this case, the master will move toward the supply $V_{CC}$ and be clampled through the emitter on transistor T2 through the Schottky diode D1 that goes into the collector of transistor T6. This causes transistor T2 to turn on, which diverts the base drive from transistor T1 through the emitter of T2 to ground through the Schotty diode D1 and the collector-emitter path of transistor T6. When transistor T7 turns on to clock the flip-flop, the current is transferred from one emitter to the other emitter of transistor T2 and flows out the clock line. When the collector potential of T7 approaches ground potential, then the saturated voltage of the collector of T7 plus the collector-emitter potential of saturated T2 is applied to an emitter on transistor T5. The base current of transistor T5 flows out of this emitter through the two saturated transistors T2 and T7 to ground. This deprives transistor T6 of base drive, thereby biasing it off, allowing the collector T6 to go high. This allows two high potentials to be applied to the emitters of Schottky transistor T4 and the base drive of transistor T4 now flows out its collector and into the base of transistor T3, biasing T3 on. The flip-flop is now in a stable state. If the clock transistor T7 turns off, the potential at the master will rise and this time be clamped through the emitter on T1 through the Schottky diode D2 that is connected to the collector of transistor T3. This causes the master to be in the opposite state from that which it occupied previously. When the clock again goes low, it transfers and pulls current out of one of the emitters of transistor T4 through transistors T1 and T7. This in turn deprives transistor T3 of base drive, allowing its collector to go high and there are two highs on the emitter of transistor T5. The base current for T5 now flows into T6 and it turns on again, completing one complete toggle cycle.

The function of the "clear" input is to cause the Q output to go to zero. The function of the preset is to cause the Q output to go to a logic 1. The logic levels going into the "clear" or "preset" have a slight priority with respect to the clock. They are all fed by saturated transistors. For a clock to take place, the preset and clear signals must both be high. For a preset or clear to occur, it is desirable for the clock to be high. This is illustrated in the waveform of FIG. 10B.

With reference to FIG. 11, there is illustrated a schematic of an RS flip-flop which may be utilized in accordance with the present invention. Here the master of the flip-flop comprises transistors 183 and 184 while the slave is made up of transistors 179, 180, 181 and 182. As may be seen, transistors 180 and 181 are Schottky transistors. Operation of the RS flip-flop illustrated in FIG. 11 is very similar to the operation of the toggle element described with reference to the description of FIGS. 10A and 10B. As can be seen with reference to FIG. 15, when the RS flip-flops are utilized in shift register counter logic, the information of the slave of one element feeds to the master of a succeeding element. With reference again to FIG. 11, the Schottky diode connected between the collector of transistor 183 and the clear line is added to insure that the first flip-flop of a shift counter, such as illustrated in FIG. 15, will be able to clear. This is accomplished since this diode deprives base drive from transistor 184 thereby insuring that the master of the flip-flop is able to reach a state in which transistor 183 is turned on.

With reference now to FIG. 12, there is illustrated a JK flip-flop bipolar embodiment in accordance with the present invention. As will be described in greater detail with respect to the divide-by-twenty-four counter, FIG. 21, the JK flip-flop is advantageously utilized as a part of the counter logic. Circuit operation of the JK flip-flop is the same as that of the toggle element previously described with reference to FIGS. 10A and 10B, with the exception that two more emitters, one on each side of the master, (transistors 33 and 34) have been added along with corresponding Schottky diodes.

RIPPLE COUNTER

With reference to FIG. 13, the ripple counter contains 15 toggle flip-flop elements. Each toggle element divides its input frequency by two. The first one divides the oscillator frequency of 32,768 in half; the second one divides it in half again, etc. such that the 15th flip-flop will have an output of one hertz. The system clock signal is generated from the outputs of the last 5 flip-flops, i.e., 15, 14, 13, 12 and 11. The output on flip-flop 12 is taken from the inverted side, i.e., $\overline{Q}$. This produces a 31.25 millisecond wide pulse once every second as illustrated in the system clock waveform of FIG. 14. The last 4 flip-flops, that is, flip-flops 12, 13, 14 and 15, all have a preset line 54 which is activated by the "second" setting switch. The purpose of this preset line is to guarantee that essentially a full second will elapse before a clock pulse is generated on the system clock following release of the "seconds" preset switch. This is accomplished by presetting flip-flops 12, 13, 14 and 15 to state 1. The flip-flops then must count all the way through up to the state in which flip-flop 12 would be a zero and flip-flops 11, 13, 14 and 15 are ones before decode logic 56 enables an output on the system clock. This is shown in the timing diagram in FIG. 14.

The output of flip-flop 10, which is a 32 hertz signal, is applied through driver circuitry 26 (as explained with reference to FIG. 2) to the drivers of each segment as well as the back plane drive circuitry of the liquid crystal display. This is used to supply a 32 hertz a.c. waveform across the liquid crystal material. As will subsequently be explained with reference to FIGS. 17B and 17C, this a.c. signal enables logic in the decoder driver circuitry to control whether the voltage applied across a display segment is out of phase with the back plane voltage or in phase. If out of phase, the signal will be lit; otherwise it will remain unlit. It is preferred to drive the liquid crystal display with a.c. drive to prolong the lifetime. A 32 Hz signal has been chosen for convenience. Other frequencies may be utilized as desired.

The waveforms Q11-Q15 in FIG. 14 demonstrate the divider action of the ripple counter. The output of Q15 is a one hertz signal. All of the 15 flip-flops in the countdown chain are d.c. coupled bipolar floating master/master-slave toggle flip-flops such as described in FIG. 10.

COUNTERS

All of the counters such as illustrated generally at 22 in FIG. 1 are synchronous in accordance with the present invention. That is, each logic element receives a system clock pulse every second. The counters increment in response to the system clock pulse only when they are enabled. By way of example and with reference to FIG. 15, a divide-by-ten counter such as counter 22A in FIG. 2 is illustrated. This counter has 5 RS flip-flops, A, B, C, D and E connected as a shift register counter wherein the complemented output of the last stage, i.e., stage E, is connected to the input of the first stage by a feedback loop. With the 5 flip-flop elements 32 possible states are presented. These states are shown in Table 1.

TABLE 1

| Counter State | $Q_A$ | $Q_B$ | $Q_C$ | $Q_D$ | $Q_E$ | |
|---|---|---|---|---|---|---|
| 0 | 0 | 0 | 0 | 0 | 0 | |
| 1 | 1 | 0 | 0 | 0 | 0 | |
| 2 | 0 | 1 | 0 | 0 | 0 | * |
| 3 | 1 | 1 | 0 | 0 | 0 | |
| 4 | 0 | 0 | 1 | 0 | 0 | * |
| 5 | 1 | 0 | 1 | 0 | 0 | * |
| 6 | 0 | 1 | 1 | 0 | 0 | * |
| 7 | 1 | 1 | 1 | 0 | 0 | |
| 8 | 0 | 0 | 0 | 1 | 0 | * |
| 9 | 1 | 0 | 0 | 1 | 0 | * |
| 10 | 0 | 1 | 0 | 1 | 0 | * |
| 11 | 1 | 1 | 0 | 1 | 0 | * |
| 12 | 0 | 0 | 1 | 1 | 0 | * |
| 13 | 1 | 0 | 1 | 1 | 0 | * |
| 14 | 0 | 1 | 1 | 1 | 0 | * |
| 15 | 1 | 1 | 1 | 1 | 0 | |
| 16 | 0 | 0 | 0 | 0 | 1 | |
| 17 | 1 | 0 | 0 | 0 | 1 | * |
| 18 | 0 | 1 | 0 | 0 | 1 | * |
| 19 | 1 | 1 | 0 | 0 | 1 | * |
| 20 | 0 | 0 | 1 | 0 | 1 | * |
| 21 | 1 | 0 | 1 | 0 | 1 | * |
| 22 | 0 | 1 | 1 | 0 | 1 | * |
| 23 | 1 | 1 | 1 | 0 | 1 | * |
| 24 | 0 | 0 | 0 | 1 | 1 | |
| 25 | 1 | 0 | 0 | 1 | 1 | * |
| 26 | 0 | 1 | 0 | 1 | 1 | * |
| 27 | 1 | 1 | 0 | 1 | 1 | * |
| 28 | 0 | 0 | 1 | 1 | 1 | |
| 29 | 1 | 0 | 1 | 1 | 1 | * |
| 30 | 0 | 1 | 1 | 1 | 1 | |
| 31 | 1 | 1 | 1 | 1 | 1 | |

* Illegal State

The desired sequence of the counter is shown in Table 2.

TABLE 2

| Counter State | Count Sequence A | B | C | D | E | Binary State | |
|---|---|---|---|---|---|---|---|
| 0 | 0 | 0 | 0 | 0 | 0 | 0 | |
| 1 | 1 | 0 | 0 | 0 | 0 | 1 | |
| 2 | 1 | 1 | 0 | 0 | 0 | 3 | |
| 3 | 1 | 1 | 1 | 0 | 0 | 7 | |
| 4 | 1 | 1 | 1 | 1 | 0 | 15 | |
| 5 | 1 | 1 | 1 | 1 | 1 | 31 | |
| 6 | 0 | 1 | 1 | 1 | 1 | 30 | |
| 7 | 0 | 0 | 1 | 1 | 1 | 28 | |
| 8 | 0 | 0 | 0 | 1 | 1 | 24 | |
| 9 | 0 | 0 | 0 | 0 | 1 | 16 | TC |

This count sequence, of course, has just 10 counter states. All other states of the 32 possible states are defined to be illegal states. These states are depicted in Table 1 by asterisks. If the counter in some circumstances should occupy a state that has been defined here as an illegal state, it is required that the counter return back to the desired count loop in as short a time as possible. This is illustrated with reference to FIG. 16 in the state diagram there shown. Here state 16 is defined as the terminal count state which is the beginning of the count loop. It may be seen that a maximum of three clock pulses are required from any illegal state in order for the counter to return to the desired count loop. By way of example, if for some reason the counter should occupy counter state 14, upon the next clock pulse the counter would shift to state 29, and on the following count, it would shift to state 26 and on the next count it would shift to state 20. State 20 is a transitory state in which the counter will remain only until the clock goes high. When this occurs, the counter shifts to TC state 16.

With reference momentarily to Table 2, it may be seen that it is possible to decode any one of the counter states with a single two input gate. In the logic 58 illustrated in FIG. 15, however, a three input gate has been utilized wherein one of the inputs is from an enable line. This input insures that the counter can only produce a terminal count output when the previous counters have provided an enable signal. The clear input is routed to both the clear input of the flip-flops and the input on the enable buffer 60. This configuration is utilized since in the described embodiment the clear and enable, as well as the clock inputs, all have essentially the same priority on the master of each flip-flop. The output of the terminal count gate 58 is fed back to a clear input on the first three flip-flops A, B and C in order to insure that the counter will circulate in the sequence chosen and illustrated in Table 2. The state diagram in FIG. 16 depicts the desired or chosen circulation or counting loop as well as depicting how the counter will function when in any of the illegal states and how it subsequently will return into the desired loop.

DECODE LOGIC

With reference to FIG. 17A, decode logic suitable for use with the divide-by-ten counter such as described with reference to FIG. 15 is illustrated. The logic is configured such that it will display the numerals 0–9 on a 7 segment decode display. The logic is effected such that in the 22 illegal states in which the divide-by-ten counter may occupy, valid display information will not be effected using the 7 bars. That is, recognizable numerals will not be displayed. The decode logic for the various counters of the system are similar and detailed explanation is not required. Operation of the decode circuitry can be seen by reference to the logic drawings.

DRIVE CIRCUITS

With reference to FIG. 17B, the drive circuitry for energizing the respective segments of the liquid crystal display is illustrated. The portion of the circuit enclosed by the dashed lines 62 is common to all of the display segments of the liquid crystal display. The remaining circuitry is required for each segment of the 7 bar display. Logic signals from the counter circuit such as described with reference to FIG. 17A is applied to the emitter terminals of transistor Q1 and is effective to activate the required display segments. Operation of the driver circuitry will now be described.

Assume that the logic input of the two emitters to Q1 are both high, and that the a.c. input of Q6 is high. This a.c. input is the 32 hertz signal from the ripple counter previously described. For this situation, Q7 is turned on and therefore a low voltage is present at the collector of Q7. Thus Q8 has current flowing out of its emitter, biasing Q24 off. Transistor Q9 is biased on and Q10 is biased off. Since Q10 is off, the output labeled back plane will pull toward the supply V2.

Now with reference to transistor Q1, its two emitters are assumed to both be high. Therefore, Q2 is biased on and its collector is close to ground. This means that Q4 is biased off. Since Q7 is biased on and its collector is close to ground, Q3 will be biased off because of the lower forward drop of the Schottky diode D1. Since both Q3 and Q4 are off, the output labeled segment is pulled close to V2 through Q14 and Q15. Both the segment and the back plane side of the liquid crystal display are close to V2. Now assume that the a.c. input signal on the emitter of Q6 goes to ground. This will turn transistor Q7 off allowing its collector to rise. This means that the current going into the base of Q8 will come out of the collector of Q8 and thus bias Q24 on. This will turn Q9 off which will in turn bias Q10 on.

Thus the back plane side of the liquid crystal will be drawn close to ground through diode D3 and the collector-emitter potential of transistor Q10. Also, since Q7 is turned off, transistor Q3 will turn on with its base drive going through its base-emitter junction and through the collector-emitter of Q2. The collector of Q3 will be two collector-emitter voltages above ground and the segment side of the liquid crystal will be one Schottky diode D2 higher than the collector of Q3. Since both terminals of the liquid crystal are close to ground, the liquid crystal will again stay unlit. In a similar manner, if a single zero is applied to either or both emitters of Q1, an out of phase potential will be applied across the segment of the liquid crystal effecting a display.

With reference to the waveforms depicted in FIG. 17C, it may be seen that the effective potential difference across the display, i.e., $V_{T1} - V_{T2}$ is zero when the logic inputs are logic once since the voltages $V_{T1}$ and $V_{T2}$ are in phase. When the logic input becomes a logic 0 the waveform of $V_{T1}$ is changed at 63 so that it becomes out of phase with $V_{T2}$. Thus, a potential difference is established across the display during the period to the right of dashed line 65 (FIG. 17C).

DIVIDE-BY-SIX COUNTER

With reference to FIGS. 18-20, the logic state diagram and waveforms of a divide-by-six counter which may be utilized in accordance with the present invention is illustrated. The divide-by-six counter is very similar to the divide-by-ten counter previously described with reference to FIG. 15 in that it is a shift register counter utilizing RS flip-flop elements. The only difference lies in the fact that the gate 64 used to correct the counter and guarantee that it is operating within the loop desired (reference FIG. 19) is separate from the gate 66 used to decode the terminal count for this counter. This is done so that when an inhibit signal is applied to the terminal count gate 66 to prevent an output from incrementing a succeeding counter, the present counter can still correct itself.

Table 3 illustrates the possible states of the divide-by-six counter, while Table 4 illustrates the desired count sequence. This desired count sequence is further illustrated in state diagram depicted in FIG. 19. All states other than those desired are labeled illegal states in Table 3 and these illegal states are identified by an asterisk.

The waveforms for the clock $Q_A$, $Q_B$ and $Q_C$ outputs are illustrated in FIG. 20.

TABLE 3

|   | Possible States | | |
|---|---|---|---|
|   | A | B | C |
| 0 | 0 | 0 | 0 |
| 1 | 1 | 0 | 0 |
| 2 | 0 | 1 | 0 | *
| 3 | 1 | 1 | 0 |
| 4 | 0 | 0 | 1 |
| 5 | 1 | 0 | 1 | *
| 6 | 0 | 1 | 1 |
| 7 | 1 | 1 | 1 |

*Illegal State

TABLE 4

| Counter State | Count Sequence | | | Binary State |
|---|---|---|---|---|
|   | A | B | C |   |
| 0 | 0 | 0 | 0 | 0 |
| 1 | 1 | 0 | 0 | 1 |
| 2 | 1 | 1 | 0 | 3 |

TABLE 4-continued

| Counter State | A | Count Sequence B | C | Binary State |
|---|---|---|---|---|
| 3 | 1 | 1 | 1 | 7 |
| 4 | 0 | 1 | 1 | 6 |
| 5 | 0 | 0 | 1 | 4 |

DIVIDE-BY-TWENTY-FOUR LOGIC

With reference to FIG. 21, the logic required for the divide-by-twenty-four counter in accordance with the present invention is illustrated. The divide-by-twenty-four counter is used as the hours counter in the present system. This particular counter utilizes three types of flip-flop elements, the toggle element (T), the RS element and the JK element. The first two flip-flops form a divide-by-three shift counter in which the first flip-flop is a JK flip-flop and the second one, i.e., the B element, is an RS flip-flop. The C, D and E elements are all toggle elements forming divide-by-two circuits. The decoder for the divide-by-twenty-four counter decodes both units and tens digits. The output of the E flip-flop in a divide-by-twenty-four counter is fed through a couple of gates and the output of these gates is then routed to the decoder. A control line 72 into these gates either enables the information from the E flip-flop to be sent on to the decoder or it inhibits the data and makes the data to the decoder appear as if the counter had the E flip-flop in the zero state. When the data is inhibited for the E flip-flop, the decoder will display 1–12 hours only and then start over displaying 1–12 again. When the data is enabled to go into the decoder from the E flip-flop, the output of the decoder will be from 1–24 and then return to 1 again.

The possible counter states are illustrated in Table 5. The desired state diagram of the divide-by-twenty-four counter is illustrated in FIG. 22. As may be seen with reference to FIG. 22, a maximum of only one clock pulse is required to return the counter to the desired loop if it should occupy any of the forbidden states.

TABLE 5

|    | A | Counter Sequence B | C | D | E | Binary States |
|----|---|---|---|---|---|---|
| 1  | 1 | 0 | 0 | 0 | 0 | 1 |
| 2  | 1 | 1 | 0 | 0 | 0 | 3 |
| 3  | 0 | 1 | 0 | 0 | 0 | 2 |
| 4  | 1 | 0 | 1 | 0 | 0 | 5 |
| 5  | 1 | 1 | 1 | 0 | 0 | 7 |
| 6  | 0 | 1 | 1 | 0 | 0 | 6 |
| 7  | 1 | 0 | 0 | 1 | 0 | 9 |
| 8  | 1 | 1 | 0 | 1 | 0 | 11 |
| 9  | 0 | 1 | 0 | 1 | 0 | 10 |
| 10 | 1 | 0 | 1 | 1 | 0 | 13 |
| 11 | 1 | 1 | 1 | 1 | 0 | 15 |
| 12 | 0 | 1 | 1 | 1 | 0 | 14 |
| 13 | 1 | 0 | 0 | 0 | 1 | 17 |
| 14 | 1 | 1 | 0 | 0 | 1 | 19 |
| 15 | 0 | 1 | 0 | 0 | 1 | 12 |
| 16 | 1 | 0 | 1 | 0 | 1 | 21 |
| 17 | 1 | 1 | 1 | 0 | 1 | 23 |
| 18 | 0 | 1 | 1 | 0 | 1 | 22 |
| 19 | 1 | 0 | 0 | 1 | 1 | 25 |
| 20 | 1 | 1 | 0 | 1 | 1 | 27 |
| 21 | 0 | 1 | 0 | 1 | 1 | 26 |
| 22 | 1 | 0 | 1 | 1 | 1 | 29 |
| 23 | 1 | 1 | 1 | 1 | 1 | 31 TC |
| 24 | 0 | 1 | 1 | 1 | 1 | 30 |

DATE INCREMENT LOGIC AND MEMORY ELEMENT

Figure 9:
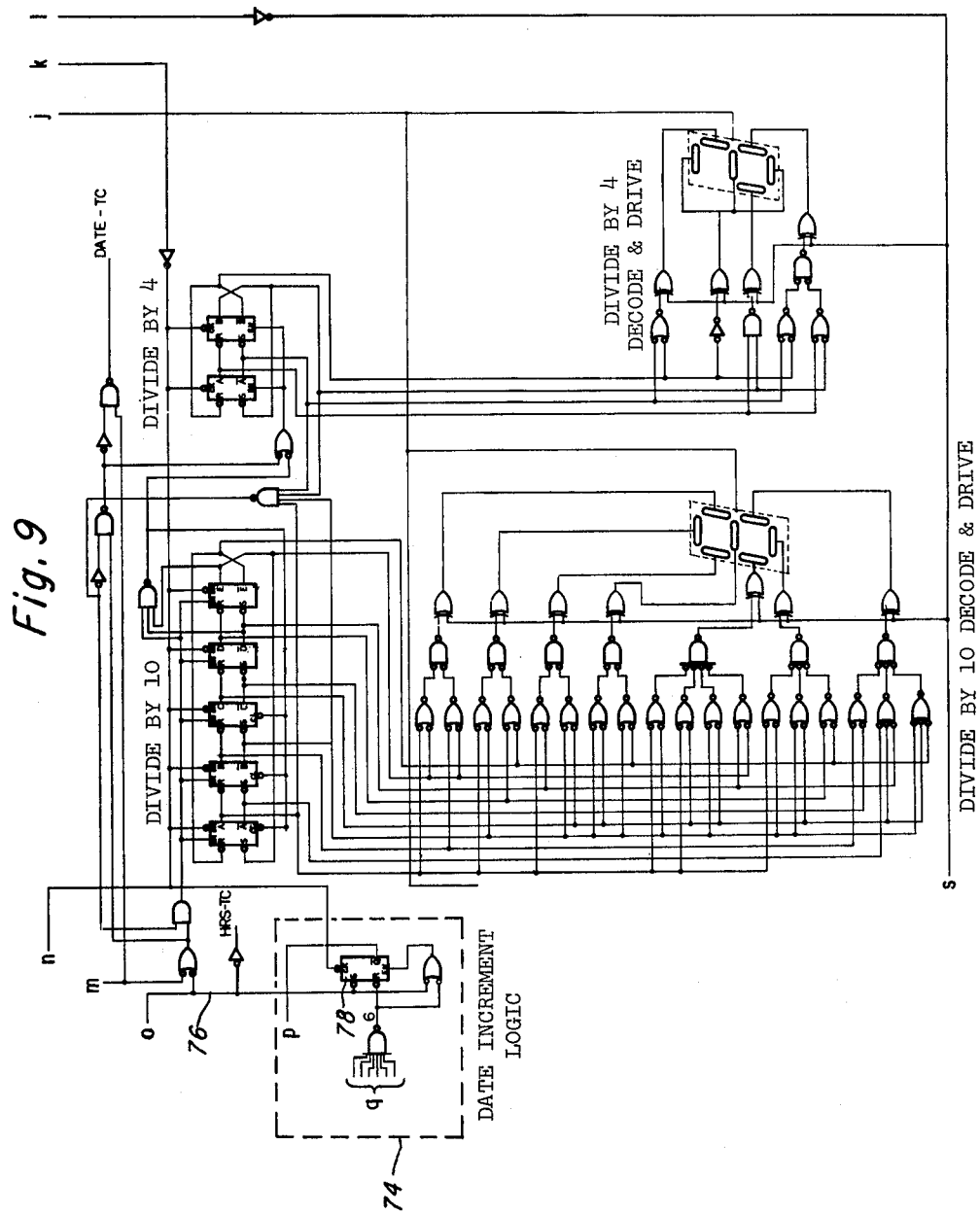

This logic is illustrated within the dashed lines 74 with reference to FIG. 9. Operation of this logic is as follows. The terminal count 76 of the hours counter, i.e., the divide-by-twenty-four, sets an RS flip-flop element 78 when it enables the date counter, i.e., the divide-by-thirty-one, to increment once. The flip-flop element 78 is fed back into the terminal count gate 80 (FIG. 8) of the hours counter and inhibits it from further incrementing the date counter. The flip-flop 78 is reset when the hours counter is allowed to count through the hour 6 by itself, and it is then allowed to reset, thereby again enabling the terminal count of the hours counter. If the hours counter is being incremented because the hour set button (FIG. 8) is being activated, the memory element for the data increment can neither be set nor reset.

A.M./P.M. INDICATOR

The a.m./p.m. indicator circuit logic is illustrated in FIG. 23. The a.m./p.m. indicator is a liquid crystal display segment which serves the purpose of showing in the 12 hour mode whether the counter is in the first 12 hours or the second 12 hours. The a.m./p.m. indicator lights during the p.m., i.e., the second 12 hours. In the 24 hour display mode, the a.m./p.m. indicator is lit continuously. The a.m./p.m. indicator segment is preferably located between the hours and the minutes display.

DIVIDE-BY-THIRTY-ONE COUNTER

The logic circuitry for the divide-by-thirty-one counter is illustrated in FIG. 24. The divide-by-thirty-one counter is comprised of a divide-by-ten counter shown generally at 84 and a divide-by-four counter 86. The divide-by-ten counter is for the units digit, the divide-by-four counter is for the tens digit. The elements that make up the two counters are RS flip-flops. Logic shown generally at 86 is effective to modify the sequence when the count reaches thirty-one and return the counter to one.

REGULATORS

The regulator circuitry in accordance with the present invention is described with reference to FIGS. 25-31. At this juncture it is noted that power requirements for a battery operated electronic wrist watch dictate that large resistances, in the hundreds of megohm range, be utilized. Such resistors are too large to integrate in bipolar integrated circuits. As a result, the system of the present invention advantageously utilizes current sources in lieu of load resistors. Techniques for eliminating limiting resistors in bipolar IC's are described, for example, in "Integrated Injection Logic, A Breakthrough in the Field of Integrated Circuits", *Microelectronics and Reliability*, Pergamon Press, 1972, Vol. 11, page 94. The "current injection" technique of the present invention (reference FIGS. 28, and 29) provides numerous advantages over the above referenced article, including compatibility with high voltage output requirements.

The basic operation of a current source is depicted in FIG. 26. Transistor 1 defines a reference along with resistor R. Transistor 1 has its base and collector tied together and forms a diode. The current through this diode forms a voltage reference. The assumption is made that the base drive required in transistor 1 is small compared to its emitter current. When transistor 2 is connected as shown in FIG. 26, the potential established by the base-emitter drop of transistor 1 is placed across the base-emitter of 2. Therefore, the current that flows in the emitter of transistor 2 will be the same as that which flows in the emitter of transistor 1. It is assumed that I2 and I5 are much smaller than the emitter currents I1 and I4. Therefore, the assumption is that the sum of I2 and I5, i.e., I7, is much smaller than the current I3. Thus, the current I3 is determined by the value of resistor R. If transistors 1 and 2 are well-matched, then the collector current I6 of 2 will be essentially identical to the current that flows through the resistor R. The practical limitations of this type circuit are apparent in FIG. 27. When the basic current source is extended to have many current sources connected to it, then the assumption which was made above that the base current is small compared to the collector current in the reference section no longer holds. Also, the current that is established by the resistor R is directly dependent upon the supply voltage V.

In accordance with the present invention, a circuit is provided which sets a current $I_C$ in the reference that is independent of supply voltage and also which is independent of the base current from the current sources $I_B$ (FIG. 27). The regulator circuit of the present system is illustrated in FIG. 25, wherein a fixed current flows in the emitter of transistor 5.

Operation of the regulator circuit is as follows. The current I2 in FIG. 25 is set to be about 15 times as large as the current I1. This ratio is established by the geometries of transistors 1, 2, 3 and 4. This ratio is not critical. Because of the ratio between currents I2 and I1, the base-emitter voltages of transistor 6 and 7 are different. This voltage difference appears across the external resistor which is connected to pad 13. This resistor may, for example, be on the order of 68K ohms. Three-fourths of the collector current of reference transistor 5 flows through this resistor to ground since three of the four collectors are commonly connected thereto. If the current flowing through reference transistor 5 becomes too large, the potential across the resistor will increase. This causes more of current I1 to go to base drive for transistor 7. Therefore, more of current I2 will become collector current of transistor 7, depriving transistor 8 of its base drive. When transistor 8 begins to turn off, it reduces the base drive to all of the p-n-p transistors used as current sources. Therefore, transistor 5 loses its base drive and its current must decrease. If the current in transistor 5 decreases too much, the voltage across the resistor will drop drawing more of the current of I1 into the resistor. This deprives transistor 7 of base drive and allows more of current I2 to go to base drive for transistor 8. This increases the base drive to transistor 5 and all of the p-n-p transistors which are used as current sources. The regulator circuit has a sufficient dynamic range to adjust itself to a fixed current established solely by the resistor connected to pad 13. The current established is thus independent of supply voltage. The capacitor which is connected between the collector and the base of transistor 7 is used to compensate the regulator and keep it from oscillating. The resistor which is connected in the collector of transistor 8 is there to prevent SCR action from latching the regulator. Transistors 9, 10 and the resistor attached to bonding pad 11 are used as a starting circuit to guarantee that the regulator will start up. One collector of transistor 5 goes to bonding pad 21. The current out of this collector is used as a reference for the slave current regulator 16b (FIG. 2).

A schematic of the slave regulator is illustrated in FIG. 30. Transistors 3, 4 and 5 form a current source which is directly dependent upon the current from the reference node of the master regulator described in FIG. 25. Transistor 3 forms a reference base-emitter potential which then sets the emitter currents in transistors 4 and 5. Because of the difference in the number of emitters between transistors 3 and 4 and transistor 5, there is an 8 to 1 ratio between the currents that flow in the collectors of transistors 4 and 5. Transistor 2 is a reference transistor for all of the current sources controlled by slave regulator. Its current is established primarily by the collector current of transistor 5. A small amount of the current out of the collector of transistor 2 is used for base drive to transistor 6. If the current in transistor 2 becomes too large, all the excess current becomes base drive for transistor 6, which then diverts base drive from transistor 7 thereby reducing the base drive to transistor 2 and bringing its collector current back in line. If the current in transistor 2 is too small, then transistor 6 will be deprived of base drive. Transistor 7 will then receive additional base drive and it in turn will supply additional base drive for transistor 2. The capacitor between the collector and the base of transistor 6 is used to compensate the regulator and keep it from oscillating.

CURRENT SOURCE

With reference to FIGS. 28, 28A and 29, a typical four collector p-n-p transistor which is used as a current source load in accordance with the present invention is illustrated. FIG. 28 is a plan view illustrating the layout of a typical current source transistor. For the illustrated example, a substrate 91 may, by way of example, be comprised of p-type silicon. A $p+$ diffusion 88 defines an isolation barrier between various components on the substrate. The base region of the transistor comprises an n-type epi layer 90. A DUF $n+$ region 92 is formed to underlie the transistor structure. An $n+$ region 94 is formed for the base contact. Collectors C1, C2, C3 and C4 are formed around a central $p$ diffused emitter region 96. The transistor is schematically illustrated in FIG. 28A. Conventional integrated circuit fabrication techniques may be utilized in fabricating the transistor structure. Such techniques are well-known to those skilled in the art and need not be explained in detail herein.

15 Volt Regulator Circuit

With reference to FIG. 31, there is schematically illustrated a 15 volt regulator that may be used in accordance with the present invention to set a preselected current. In accordance with the illustrated embodiment a current of approximately 5 nano-amps is preferred. With reference to FIG. 31, transistor 8 defines the reference transistor. The regulator operates as follows. A single collector from a 50 nano-amp current source provides approximately 10 nano-amps of current in one of its four collectors. This current flows into the collectors of transistors 3 and 4 providing approximately 5 nano-amps in each of the respective emitters. Transistors 3 and 4 act as a reference for transistor 5 thereby setting an approximately 5 nano-amp emitter current in transistor 5. The Schottky diode 2 and the transistor 6 are used in order to provide a potential between the collector and emitter of transistor 5 close to one diode drop which is what transistors 3 and 4 see across their collector-emitter junction. The zener diode 7 is used to reduce the collector-emitter potential across transistor 6. Transistors 9 and 10 form a Darlington configuration emitter-follower circuit reducing the base current resulting from all of the current sources of transistor 11 by a factor of $\beta^2$.

DC/DC CONVERTOR

The DC to DC convertor receives an input from a low voltage battery, typically in the range of about 1.35 volts. The output is approximately the 15 volts required for operation of the liquid crystal display.

The convertor is schematically depicted in FIG. 32a. Operation is as follows:

The transistor Q and transformer T form a basic blocking oscillator. The AC generated in the winding $W_1$ is peak-to-peak detected ("doubled") by capacitor $C_1$ and the two diodes $D_1$ and $D_2$. This is the output voltage and is stored in the output capacitor $C_2$.

For purposes of explanation, assume that there is a switch $S_1$ in the circuit as shown, with positions A and B.

If the switch is in the A position, the period between bursts of blocking oscillations will be set by the capacitor $C_3$ and resistor R. This may be shown as follows. Assume a small negative voltage at the base of the transistor Q, insufficient to bias the base into conduction. Current will flow from the battery ($V_{in}$) through the resistor, and in time will reach a value sufficient to bias the base into conduction. Because of the blocking oscillator configuration, the current flow now becomes regenerative. Current increases in both the base and collector circuits until the transformer core becomes saturated, at which time the base drive collapses and a regenerative turn off cycle is initiated. The collapsing field in the core induces a voltage in the output $W_1$ winding, and in the base $W_3$ winding. The voltage in the base winding is clipped by the detector action of the base-emitter junction of the transistor. This clipping action occurs during a period of operation when the transformer is on. After a few cycles of the blocking oscillation, the negative voltage stored in the capacitor $C_3$ is depleted to such an extent that the base of the transistor is again cut off. This completes a burst of the blocking oscillator. Current will again flow in the resistor and cause another burst in a given period of time. The time between bursts will be set by the resistor and base capacitor $C_3$ and by the amount of charge removed from the base capacitor by the detector action of the base.

If the switch is now placed in the "B" position, which is the way the circuit is actually implemented, the load regulation characteristics of the circuit can be examined. Operation is essentially as before, with one important difference. Each blocking burst tends to enhance the negative charge on the capacitor $C_3$ since the voltage doubler is referenced to the base capacitor. The circuit is load responsive, since the load current will serve to influence the base capacitor charge. A heavy load current will cause more negative charge to be placed in the base capacitor than a light load current, and the blocking burst will be longer. The circuit is thus load responsive.

With reference to FIGS. 33A and 33B and 34, the convertor includes a cup transformer core having mating halves 23 and 25. Suitable core materials are known in the art. A conventional core half is illustrated in FIG. 33a. This core has a notch 27 for extracting leads. It will be noted that the peripheral edge surface 29 is flat. With reference to FIG. 33b, the modification to the core half in accordance with the invention are illustrated. As may be seen, a portion of the peripheral edge is removed in regions 31. As illustrated, these recessed regions extend on both sides of the notch 27. Such a configuration is not essential, and the recessed regions may be formed in other locations around the periphery as desired.

Maximum inductance, and hence minimum convertor cycle rate and lowest voltage, occurs with the peripheral flats of the two halves in alignment. Minimum inductance, as a result of minimized magnetic cross sectional area, and hence higher peak primary currents and repetition frequency and highest output voltage occurs when the flats 29 of one half are opposite the notched areas 31 of the other half. Wide variations in voltage are possible with the technique and control is smooth throughout the range.

Due to fixed core loses and minimum losses in the air gap, the convertor exhibits practically the same efficiency at any output level.

The requirements of the wrist watch system dictate that a large capacitor 35 be mounted beneath the transformer. Therefore, in a preferred embodiment, a plastic saddle 33 is used to straddle the capacitor and mount the transformer.

The transformer may be assembled on the saddle, and a "speed nut" type clip 37 pushed down over the protruding end of a mounting post 39 on top of the saddle. The clip provides the necessary pressure to hold the two core halves tightly together. This advantageously provides a low profile structure.

The post 39 on the back (top) of the saddle can be fabricated with a small amount of "mold relief" angle (taper) so that the lower core half fits snuggly, and the top half is free to rotate as necessary. Wires exit the notch 41 in the lower half.

With reference to FIG. 32b, the output characteristics of the d.c. to d.c. convertor illustrated in FIG. 32a is illustrated. The circuit had a 1.365 V input. Winding $W_1$ had 130 turns and $W_2$ and $W_3$ each had 30 turns. The curves show output voltage tuning range, efficiency and power requirements.

While various embodiments have been described in detail herein, it will be apparent to those skilled in the art that various changes may be made without departing from the spirit or scope of the invention.

We claim:

1. An electronic watch including a timekeeping circuit supplied from a voltage source of miniature batteries comprising:
    (a) electro-optical display devices for displaying hours, minutes and seconds, said display devices, said timekeeping circuit and said battery voltage source being contained within a watch case with said display device being visible from without for reading the displayed time;
    (b) a frequency source providing clocking signals, said timekeeping circuit being coupled to said frequency source and including a plurality of counter circuits responsive to said frequency source for producing time indicative output signals and decode circuits coupled to said counter circuits for converting said time indicative output signals to display coded format;
    (c) a constant current regulator having an input and an outut, said regulator being connected at its input to said battery voltage source;
    (d) a plurality of bipolar transistor current sources connected in common to the output of said regulator, said counters and said decode circuits being implemented by current driven bipolar transistor integrated DC coupled flip flops and logic elements without load resistors or charge storage devices, said bipolar transistor current sources being coupled to said flip flop and logic elements for supplying current individually to respective ones of the transistors of said flip flop and logic elements; and (e) driver circuits coupled to said battery voltage source and coupled between said decode circuits and said electro-optical display devices for impinging required current and voltage levels on said display elements to effect a visible display of time thereon.

2. The electronic watch according to claim 1 wherein said timekeeping circuit is comprised of integrated bipolar transistor current injection logic.

3. The electronic watch according to claim 1 wherein said counting circuits include a countdown chain, a seconds counter coupled to said countdown chain, a minutes counter coupled to said seconds counter and an hours counter coupled to said minutes counter and wherein a time setting mechanism is individually coupled to an incrementing input of at least said minutes counter and said hours counter, said time setting mechanism being operable to increment the states of each of the respective counters independently from the remaining counters to set the watch to a selected time.

4. The electronic watch according to claim 1 wherein said display elements are liquid crystal display elements and wherein a DC-DC converter is provided for coupling said driver circuits to said battery voltage source for increasing the voltage level to said driver circuits.

* * * * *